(12) United States Patent
Redgrave

(10) Patent No.: US 10,313,641 B2
(45) Date of Patent: Jun. 4, 2019

(54) SHIFT REGISTER WITH REDUCED WIRING COMPLEXITY

(71) Applicant: Google LLC, Mountain View, CA (US)

(72) Inventor: Jason Rupert Redgrave, Mountain View, CA (US)

(73) Assignee: Google LLC, Mountain View, CA (US)

(*) Notice: Subject to any disclaimer, the term of this patent is extended or adjusted under 35 U.S.C. 154(b) by 52 days.

(21) Appl. No.: 15/352,260

(22) Filed: Nov. 15, 2016

(65) Prior Publication Data

US 2017/0163931 A1  Jun. 8, 2017

Related U.S. Application Data

(60) Provisional application No. 62/263,530, filed on Dec. 4, 2015.

(51) Int. Cl.
*G06T 1/20* (2006.01)
*G11C 7/10* (2006.01)
(Continued)

(52) U.S. Cl.
CPC .......... *H04N 9/045* (2013.01); *G06F 15/173* (2013.01); *G06F 15/8015* (2013.01); *G06T 1/20* (2013.01);
(Continued)

(58) Field of Classification Search
CPC ............ H04N 5/907; G06T 1/20; G11C 19/38
See application file for complete search history.

(56) References Cited

U.S. PATENT DOCUMENTS

| 4,445,177 A | 4/1984 | Bratt et al. |
| 4,935,894 A | 6/1990 | Ternes et al. |
(Continued)

FOREIGN PATENT DOCUMENTS

| EP | 0293701 A2 | 12/1988 |
| EP | 244973 A1 | 4/2012 |
(Continued)

OTHER PUBLICATIONS

Pelc, Oscar, "Multimedia Support in the i.MX31 and i.MX31L Applications Processors", Freescale Semiconductor, Inc., Feb. 2006, http://cache.freescale.com/files/32bit/doc/white_paper/IMX31MULTIWP.pdf, 12 pages.
(Continued)

*Primary Examiner* — Jason A Flohre
(74) *Attorney, Agent, or Firm* — Fish & Richardson P.C.

(57) ABSTRACT

A shift register is described. The shift register includes a plurality of cells and register space. The shift register includes circuitry having inputs to receive shifted data and outputs to transmit shifted data, wherein: i) circuitry of cells physically located between first and second logically ordered cells are configured to not perform any logical shift; ii) circuitry of cells coupled to receive shifted data transmitted by an immediately preceding logically ordered cell comprises circuitry for writing into local register space data received at an input assigned an amount of shift specified in a shift command being executed by the shift register, and, iii) circuitry of cells coupled to transmit shifted data to an immediately following logically ordered cell comprises circuitry to transmit data from an output assigned an incremented shift amount from a shift amount of an input that the data was received on.

19 Claims, 18 Drawing Sheets

(51) Int. Cl.
*H01P 5/12* (2006.01)
*H04N 9/04* (2006.01)
*G06F 15/80* (2006.01)
*G11C 19/00* (2006.01)
*G11C 19/28* (2006.01)
*G11C 19/38* (2006.01)
*H04N 5/907* (2006.01)
*G06F 15/173* (2006.01)
*H03K 19/177* (2006.01)

(52) U.S. Cl.
CPC ............ *G11C 7/1075* (2013.01); *G11C 19/00* (2013.01); *G11C 19/38* (2013.01); *H01P 5/12* (2013.01); *H03K 19/17744* (2013.01); *H04N 5/907* (2013.01); *G11C 19/28* (2013.01)

(56) References Cited

U.S. PATENT DOCUMENTS

| | | | |
|---|---|---|---|
| 4,992,933 A * | 2/1991 | Taylor | G06F 9/30196 712/209 |
| 5,253,308 A | 10/1993 | Johnson | |
| 5,455,525 A * | 10/1995 | Ho | H03K 19/17704 326/39 |
| 5,612,693 A | 3/1997 | Craft et al. | |
| 5,751,864 A | 5/1998 | Moriwake et al. | |
| 5,771,268 A | 6/1998 | Aoki et al. | |
| 5,892,962 A | 4/1999 | Cloutier | |
| 6,049,859 A | 4/2000 | Gliese et al. | |
| 6,366,289 B1 | 4/2002 | Johns | |
| 6,587,158 B1 | 7/2003 | Dale et al. | |
| 6,728,862 B1 | 4/2004 | Wilson | |
| 6,745,319 B1 | 6/2004 | Balmer et al. | |
| 6,970,196 B1 | 11/2005 | Masatoshi et al. | |
| 7,010,177 B1 | 3/2006 | Mattison | |
| 7,167,890 B2 | 1/2007 | Lin et al. | |
| 7,200,287 B2 | 4/2007 | Fukuda et al. | |
| 7,286,717 B2 | 10/2007 | Nomizu | |
| 7,454,593 B2 * | 11/2008 | Kirsch | G06F 15/17337 712/11 |
| 7,574,582 B2 * | 8/2009 | Nolan | G06F 15/8007 712/16 |
| 7,581,080 B2 * | 8/2009 | Beaumont | G06F 9/30036 712/17 |
| 7,583,851 B2 | 9/2009 | Kudo et al. | |
| 7,913,062 B2 * | 3/2011 | Beaumont | G06F 5/015 712/12 |
| 7,941,634 B2 * | 5/2011 | Georgi | G06T 1/60 712/10 |
| 8,058,899 B2 * | 11/2011 | Vorbach | G06F 15/7867 326/39 |
| 8,156,284 B2 | 4/2012 | Vorbach et al. | |
| 8,321,849 B2 | 11/2012 | Nickolls et al. | |
| 8,436,857 B2 | 5/2013 | Twilleager | |
| 8,508,612 B2 | 8/2013 | Cote et al. | |
| 8,543,843 B1 | 9/2013 | Cheng et al. | |
| 8,650,384 B2 | 2/2014 | Lee et al. | |
| 8,749,667 B2 | 6/2014 | Noraz et al. | |
| 8,786,614 B2 | 7/2014 | Curry et al. | |
| 8,797,323 B2 | 8/2014 | Salvi et al. | |
| 8,823,736 B2 | 9/2014 | Barringer et al. | |
| 8,970,884 B2 | 3/2015 | Tsuji et al. | |
| 8,976,195 B1 | 3/2015 | Lindholm et al. | |
| 2004/0054870 A1 * | 3/2004 | Kirsch | G06F 15/17337 712/11 |
| 2005/0270412 A1 | 12/2005 | Kamon et al. | |
| 2006/0044576 A1 | 3/2006 | Tabata et al. | |
| 2006/0171501 A1 | 8/2006 | Lim | |
| 2007/0047828 A1 | 3/2007 | Ishii et al. | |
| 2007/0080969 A1 | 4/2007 | Yamaura | |
| 2007/0156729 A1 | 7/2007 | Shaylor | |
| 2008/0111823 A1 | 5/2008 | Fan et al. | |
| 2008/0244222 A1 | 10/2008 | Supalov et al. | |
| 2008/0304614 A1 | 12/2008 | Paumier et al. | |
| 2009/0002390 A1 | 1/2009 | Kuno | |
| 2009/0228677 A1 | 9/2009 | Liege | |
| 2009/0300621 A1 | 12/2009 | Mantor et al. | |
| 2009/0317009 A1 | 12/2009 | Ren | |
| 2010/0122105 A1 | 5/2010 | Arsian et al. | |
| 2010/0188538 A1 | 7/2010 | Sugawa et al. | |
| 2011/0055495 A1 | 3/2011 | Wolford et al. | |
| 2011/0087867 A1 | 4/2011 | Jacobson et al. | |
| 2011/0125768 A1 | 5/2011 | Shibao | |
| 2011/0153925 A1 | 6/2011 | Bains et al. | |
| 2012/0320070 A1 | 12/2012 | Arvo | |
| 2013/0027416 A1 | 1/2013 | Vaithianathan et al. | |
| 2013/0202051 A1 | 8/2013 | Zhou | |
| 2013/0243329 A1 | 9/2013 | Oro Garcia et al. | |
| 2013/0314428 A1 | 11/2013 | Chen et al. | |
| 2013/0318544 A1 | 11/2013 | Kuroda et al. | |
| 2014/0028876 A1 | 1/2014 | Mills | |
| 2014/0136816 A1 | 5/2014 | Krig | |
| 2014/0282611 A1 | 9/2014 | Campbell et al. | |
| 2015/0106596 A1 | 4/2015 | Vorbach et al. | |
| 2015/0212970 A1 * | 7/2015 | Chevobbe | G06F 13/4009 710/105 |
| 2016/0219225 A1 | 7/2016 | Zhu et al. | |
| 2016/0313980 A1 | 10/2016 | Meixner et al. | |
| 2016/0313984 A1 | 10/2016 | Meixner et al. | |
| 2016/0313999 A1 | 10/2016 | Meixner et al. | |
| 2016/0314555 A1 | 10/2016 | Zhu et al. | |
| 2016/0316094 A1 | 10/2016 | Meixner et al. | |
| 2016/0316107 A1 | 10/2016 | Shacham et al. | |
| 2016/0316157 A1 | 10/2016 | Desai et al. | |

FOREIGN PATENT DOCUMENTS

| | | |
|---|---|---|
| JP | H02-46598 | 2/1990 |
| JP | 2013090070 | 5/2013 |
| WO | WO 9409595 A1 | 4/1994 |
| WO | WO 2007/071883 A2 | 6/2007 |

OTHER PUBLICATIONS

Mody, et al., "High Performance and Flexible Imaging Sub-System." In Advances in Computing, Communications and Informatics (ICACCI), 2014 International Conference, pp. 545-548. IEEE, 2014.

Van der Wal, et al., "The Acadia Vision Processor", IEEE proceedings of International Workshop on Computer Applications for Machine Perception, Sep. 2000, http://citeseerx.ist.psu.edu/viewdoc/download?doi=10.1.1.32.3830&rep=rep1&type=pdf, 10 pages.

Stein, et al., "A Computer Vision System on a Chip: A Case Study From the Automotive Domain." IEEE Computer Society Conference, p. 130, 2005.

Tanabe, et al., "Visconti: multi-VLIW image Recognition Processor Based on Configurable Processor [obstacle detection applications]", Custom Integrated Circuits Conference, IEEE, 2003, http://ieeexplore.ieee.org/document/1249387/?arnumber=1249387&tag=1.

Mandal, et al., "An Embedded Vision Engine (EVE) for Automotive Vision Processing." In Circuits and Systems (ISCAS), 2014 IEEE Symposium, pp. 49-52, IEEE, 2014.

Bushey, et al., "Flexible Function-Level Acceleration of Embedded Vision Applications Using the Pipelined Vision Processor." In Signals, Systems and Computers, 2013 Asilomar Conference, pp. 1447-1452, IEEE, 2013.

Moloney, David, "1 TOPS/W Software Programmable Media Processor." Hot Chips 23 Symposium (HCS), IEEE, Aug. 2011, 24 pages.

Moloney, et al., "Myriad 2: Eye of the Computational Vision Storm", Hot Chips 26 Symposium (HCS), IEEE, Aug. 2014, 18 pages.

Parker, Richard, "Embedding Computer Vision in Electronic Devices: How New Hardware and Software Choices Have Changed the Designer's Approach", Future Technology Magazine, pp. 22-23, Feb. 2013.

Ahn, et al., "Evaluating the Image Stream Architecture." In ACM SIGARCH Computer Architecture News, vol. 32, No. 2, IEEE Computer Society, Jun. 2004, 14 pages.

(56) References Cited

OTHER PUBLICATIONS

Balfour, et al., "An Energy-Efficient Processor Architecture for Embedded Systems" IEEE Computer Architecture Letters 7, No. 1 p. 29-32, May 2008.
Khailany, et al., "A Programmable 512 GOPS Stream Processor for Signal, Image, and Video Processing", IEEE Journal of Solid-State Circuits, vol. 43, No. 1, pp. 202-213, Jan. 2008.
Olofsson, et al., "A 25 GFLOPS/Watt Software Programmable Floating Point Accelerator" High Performance Embedded Computing Conference, 2010, 2 pages.
De Dinechin, et al., "A Clustered Manycore Processor Architecture for Embedded and Accelerated Applications." In High Performance Extreme Computing Conference (HPEC), IEEE, pp. 1-6, Sep. 2013.
Codrescu, et al., "Hexagon DSP: An Architecture Optimized for Mobile Multimedia and Communications." IEEE Micro vol. 34, Issue 2, pp. 34-43, Mar. 2014.
Pham, et al., "NeuFlow: Dataflow Vision Processing System-On-A-Chip." IEEE 55th International Midwest Symposium, Aug. 2012, 4 pages.
Farabet, et al., "Neuflow: A Runtime Reconfigurable Dataflow Processor for Vision." IEEE Computer Society Conference, pp. 109-116, Jun. 2011.
Farabet, et al., "Hardware Accelerated Convolutional Neural Networks for Synthetic Vision Systems." Proceedings of 2010 IEEE International Symposium, pp. 257-260, Jun. 2010.
Chen, et al., "DaDianNao: A Machine-Learning Supercomputer." 47th Annual IEEE/ACM International Symposium, pp. 609-622, IEEE, Dec. 2014.
CEVA-MM3101: An Imaging-Optimized DSP Core Swings for an Embedded Vision Home Run, http://www.bdti.com/InsideDSP/2012/01/24/CEVA, Jan. 19, 2012, 3 pages.
Stream Processors, Inc., Company History—Foundational Work in Stream Processing initiated in 1995, https://en.wikipedia.org/wiki/Stream_Processors._Inc., 5 pages.
Gentile, et al., "Image Processing Chain for Digital Still Cameras Based on SIMPil Architecture." ICCP International Conference Workshops, pp. 215-222, IEEE, Jun. 2005.
Hameed, et al., "Understanding Sources of Inefficiency in General-Purpose Chips." ACM SIGARCH Computer Architecture News, vol. 38, No. 3, pp. 37-47, 2010.
Galal, et al., "FPU Generator for Design Space Exploration." 21st IEEE Symposium on Computer Arithmetic (ARITH), Apr. 2013, 10 pages.
Dally, William J., "Computer architecture is all about interconnect." Proceedings of 8th International Symposium High-Perf. Comp. Architecture, Feb. 2002, 11 pages.
Chenyun, et al., "A Paradigm Shift in Local Interconnect Technology Design in the Era of Nanoscale Multigate and Gate-All-Around Devices," IEEE Electron Device Letters, vol. 36, No. 3, pp. 274-226, Mar. 2015.
SCP2200: Image Cognition Processors, https://www.element14.com/community/docs/DOC-50984/l/scp2200-image-cognition-processors, Oct. 25, 2012, 2 pages.
SCP2200: Image Cognition Processors Family [Product Brief], https://www.element14.com/community/docs/DOC-50990, Oct. 26, 2012, 2 pages.
Stream Processors, Inc. Announces Storm-1 Family of Data-Parallel Digital Signal Processors, ISSCC 2007, Feb. 12, 2007, 3 pages. http://www.businesswire.com/news/home/20070212005230/en/Stream-Processors-Announces-Storm-1-Family-Data-Parallel-Digital.
NVIDIA—NVIDIA's Next Generation CUDA™ Compute Architecture: Kepler™,GK110/210, 2014, 23 pages, http://international.download.nvidia.com/pdf/kepler/NVIDIA-Kepler-GK110-GK210-Architecture-Whitepaper.pdf.
MPPA—MANYCORE, Product Family Overview http://www.kalray.eu/IMG/pdf/FLYER_MPPA_MANYCORE-4.pdf, Feb. 2014, 2 pages.
McIntosh-Smith, "A Next-Generation Many-Core Processor With Reliability, Fault Tolerance and Adaptive Power Management Features Optimized for Embedded and High Performance Computing Applications" in Proceedings of the High Performance Embedded Computing Conference (HPEC) 2008, pp. 1-2, 5.
SemiWiki.com—New CEVA-ZM4 Vision IP Does Point clouds and and More: Published Feb. 27, 2015, https://www.semiwiki.com/forum/content/4354-new-ceva-xm4-vision-ip-does-point-clouds-more.html.
Shacham, Ofer, "Chip Multiprocessor Generator: Automatic Generation of Custom and Heterogeneous Complete Platforms" Dissertation—Stanford University, May 2011, 190 pages. Part 1.
Shacham, Ofer, "Chip Multiprocessor Generator: Automatic Generation of Custom and Heterogeneous Complete Platforms" Dissertation—Stanford University, May 2011, 190 pages. Part 2.
NVIDIA Tegra K1—A New Era in Mobile Computing—Whitepapers—Jan. 2014, 26 pages.
NVIDIA Tegra X1—NVIDIA'S New Mobile Superchip—Whitepapers—Jan. 2015, 41 pages.
Brunhaver, John S. "Design and Optimization of a Stencil Engine", Stanford University, Jun. 2015, 133 pages.
Oosterhout, Optimized Pixel Template Image Correlator, Master Thesis, Aug. 19, 1992, 74 pages.
Dykes et al., "Communication and Computation Patterns of Large Scale Image Convolutions on Parallel Architectures," Parallel Processing Symposium, Jan. 1, 1994, 6 pages.
Zhou, Minhua, et al., "Parallel Tools in HEVC for High-Throughput Processing," Applications of Digital Processing, XXXV, Proc. of SPI, vol. 8499, (Jan. 1, 2012), pp. 1-13.
Chen et al., "CRISP: Coarse-Grained Reconfigurable Image Stream Processor for Digital Still Cameras and Camcorders," IEEE Transactions on Circuits and Systems for Video Technology, Sep. 2008, 14 pages.
Cardells-Tormo et al., "Area-efficient 2-D Shift-variant Convolvers for FPGA-based Digital Image Processing," IEEE Workshop on Signal Processing Systems Design and Implementation, Nov. 2, 2005, 5 pages.
Gupta, et al., "A VLSI Architecture for Updating Raster-Scan Displays", Computer Graphics, vol. 15, No. 3, Aug. 1981, pp. 71-78.
Henretty, et al., "A Stencil Compiler for Short-Vector SIMD Architectures", ACM, ICS'13, Jun. 10-14, 2013, Eugene, Oregon, pp. 13-24.
Spampinato, et al., "A Basic Linear Algebra Compiler", ACM, CGO'14, Feb. 15-19, 2014, Orlando Fl, pp. 23-32.
Stojanov, et al., "Abstracting Vector Architectures in Library Generators: Case Study Convolution Filters", ARRAY 14, ACM, Jun. 11, 2014, UK, pp. 14-19.
DeVito, et al., "Terra: A Multi-Stage Language for High-Performance Computing", PLDI'13, Jun. 16-22, 2013, Seattle, Washington, 11 pages.
Sedaghati, et al., "SIVEC: A Vector Instruction Extension for High Performance Stencil Computation," Parallel Architectures and Compilation Techniques, Oct. 10, 2011, 12 pages.
Chao et al., "Pyramid Architecture for 3840 x 2160 Quad Full High Definition 30 Frames/s Video Acquisition," IEEE Transactions on Circuits and Systems for Video Technology, Nov. 1, 2010, 10 pages.
Ragan-Kelley et al., "Halide: A Language and Compiler for Optimizing Parallelism, Locality, and Recomputation in Image Processing Pipelines," Jun. 16, 2013, 12 pages.
Bolotoff, Paul V., "Alpha—The History in Facts and Comments" http://alasir.com/articles/a;pha_history/alpha_21164_21164pc.html, Last modification date Apr. 22, 2007,5 pages.
Wahib et al., "Scalable Kernel Fusion for Memory-Bound GPU Applications," SC14: International Conference for High Performance Computing, Networking, Storage and Analysis, Nov. 16, 2014, 12 pages.
Adams, et al. "The Frankencamera: An Experimental Platform for Computational Photography", ACM Transactions on Graphics, vol. 29, No. 4, Article 29, Publication Jul. 2010, 12 pages.
Levinthal, et al., "Chap-A SIMD Graphics Processor", Computer Graphics, vol. 18, No. 3, Jul. 1984, pp. 77-82.
Nightingale, Edmund B., et al., "Helios: Heterogeneous Multiprocessing with Satellite Kernels," SOSP '09, Oct. 11-14, 2009, Big Sky, Montana, U.S.A., (Oct. 11, 2009), 14 pages.

(56) References Cited

OTHER PUBLICATIONS

Eichenberger, et al., "Optimizing Compiler for the Cell Processor" PACT, Tuesday, Sep. 20, 2005, Part 1, pp. 1-16.
Eichenberger, et al., "Optimizing Compiler for the Cell Processor" PACT, Tuesday, Sep. 20, 2005, Part 2, pp. 17-32.
Kapasi, et al. "The Imagine Stream Processor", IEEE, International Conference on Computer Design: VLSI in Computers and Processors (ICCD'02), 2002, 17 pages.
Molnar, et al., "PixelFlow: High-Speed Rendering Using Image Composition" proceedings of Siggraph 92, Computer Graphics, 26, Jul. 2, 1992, 10 pages.
S.F. Reddaway,"DAP—A Distributed Processor Array", ISCA '73 Proceedings of the First Ann. Symposium on Computer Architecture, pp. 61-65.
M.J. Duff, "CLIP 4: A Large Scale Integrated Circuit Array Parallel Processor," Proc. IEEE Int'l Joint Conf. Pattern Recognition, . . . Jan. 2004, pp. 728-733.
Qadeer, et al., "Convolution Engine: Balancing Efficiency & Flexibility in Specialized Computing", ISCA '13 Tel-Aviv, Israel, ACM 2013, pp. 24-35.
Shacham, et al. "Smart Memories Polymorphic Chip Multiprocessor", Proceedings of the 46$^{th}$ Design Automation Conference (OAC), San Francisco, CA, Jul. 2009.
DeVito, et al.,"First-class Runtime Generation of High-Performance Types using Exotypes", PLDI'14, Jun. 9-11, ACM, 12 pages.
Clearspeed Whitepaper: CSX Processor Architecture, www.clearspeed. com, 2007, 16 pages.
NVIDIA, "PTX:Parallel Thread Execution ISA Version 1.4", Aug. 23, 2010, 135 pages.
Silicon Hive: "Silicon System Design of Media and Communications Applications", Jun. 13, 2007, 22 pages.
Khronos, SPIR 2.0 "Provisional Specification to Enable Compiler Innovation on Diverse Parallel Architectures", Aug. 11, 2014, 2 pages.
Arasan Netherlands, "Silicon Hive Announces New Image Signal Processor", Eindhoven, the Netherlands, May 16, 2006, http://www.design-reuse.com/news/13362/silicon-hive-image-signal-processor.html, 3 pages.
Hegarty, et al., "Darkroom: Compiling High-Level Image Processing Code into Hardware Pipelines", Proceedings of ACM SIGGRAPH, Jul. 2014, 11 pages.
SPIR, The SPIR Specification, Version 2.0, Revision Date Jun. 5, 2014, 40 pages.
Hanrahan, Pat, "Domain-Specific Languages for Heterogeneous GPU Computing", NVIDIA Technology Conference, Oct. 2, 2009, 30 pages.
Shacham, et al., "Rethinking Digital Design: Why Design Must Change", IEEE micro Magazine, Nov./Dec. 2010.
Goldstein, et al., "PipeRench: A Coprocessor for Streaming Multimedia Acceleration", Carnegie Mellow University, Research Showcase @CMU, Appears in the 26th Annual International Symposium on Computer Architecture, May 1999, Atlanta, Georgia, 14 pages.
Khawam, et al., "The Reconfigurable Instruction Cell Array", IEEE Transactions on Very Large Scale Integration (VLSI) Systems, vol. 16, No. 1, Jan. 2008, pp. 75-85.
"ChimeraTM: The NVIDIA Computational Photography Architecture" Whitepaper, NVIDIA Corporation 2013, 15 pages.
Barry, et al., "Always-On Vision Processing Unit for Mobile Applications", IEEE Micro, Mar./Apr. 2015, pp. 56-66.
EyeQ2TM, "Vision System on a Chip", Mobileye, Sep. 2007, 4 pages.
Horowitz, Mark, "Computing's Energy Problem: (and what we can do about it)", IEEE, International Solid-State Circuits Conference 2014, 46 pages.
"Multioutput Scaler Reference Design" Altera Corporation, Application Note AN-648-1.0, Aug. 2012, 18 pages.
Yu et al., "Optimizing Data Intensive Window-based Image Processing on reconfigurable Hardware Boards," Proc. IEEE Workshop on Signal Processing System Design and Implementation, Nov. 2, 2005, 6 pages.
Levinthal, "Parallel Computers for Graphics Applications", ACM, 1987, pp. 193-198.
International Preliminary Report on Patentability issued in International Application No. PCT/US2016/064034, dated Mar. 23, 2018, 13 pages.
PCT/US2016/064034—International Search Report and Written Opinion, dated Mar. 22, 2017, 13 pages.
JP Office Action issued in Japanese Appln 2018-519289, dated Apr. 1, 2019, 6 pages (with English translation).

\* cited by examiner

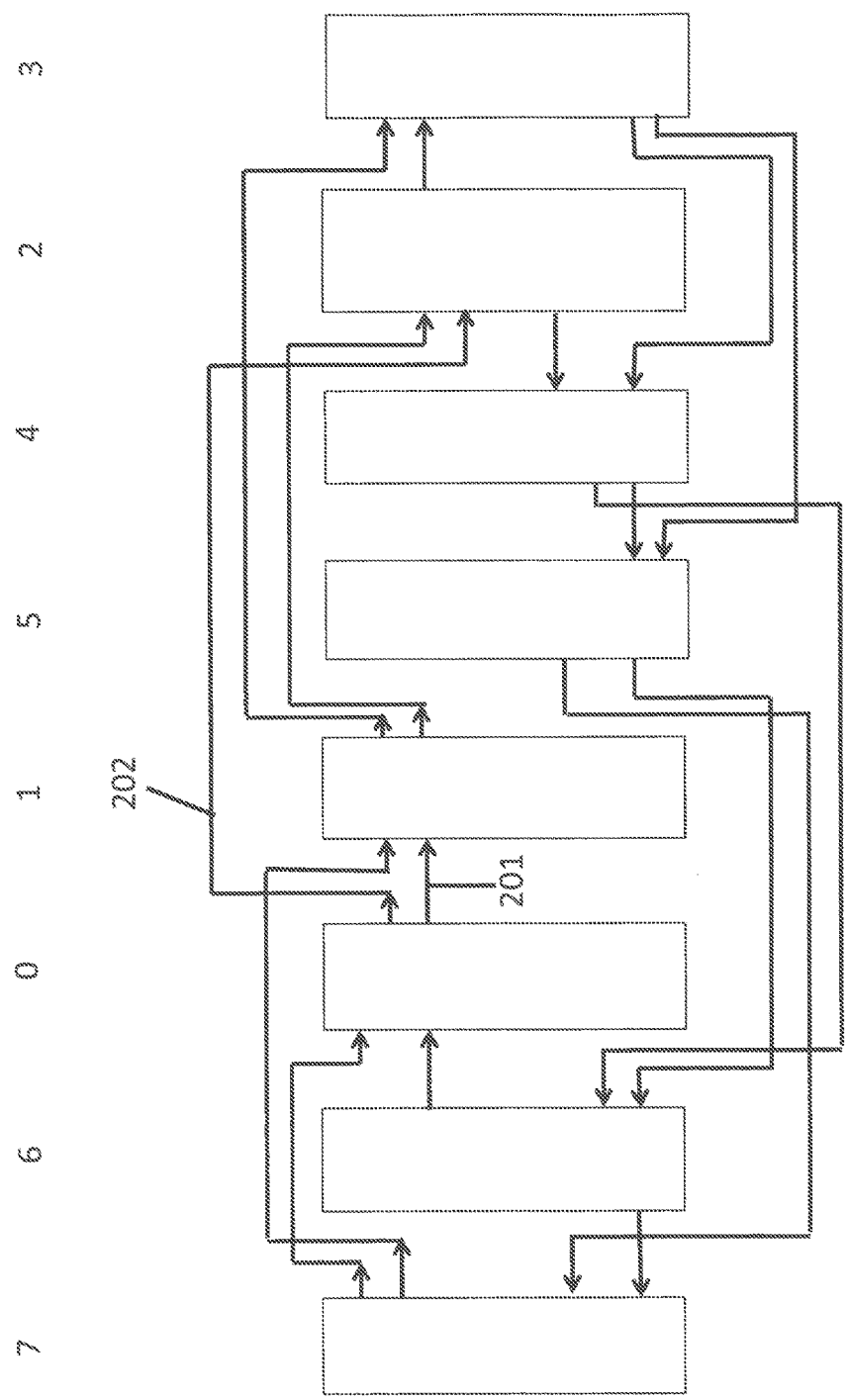

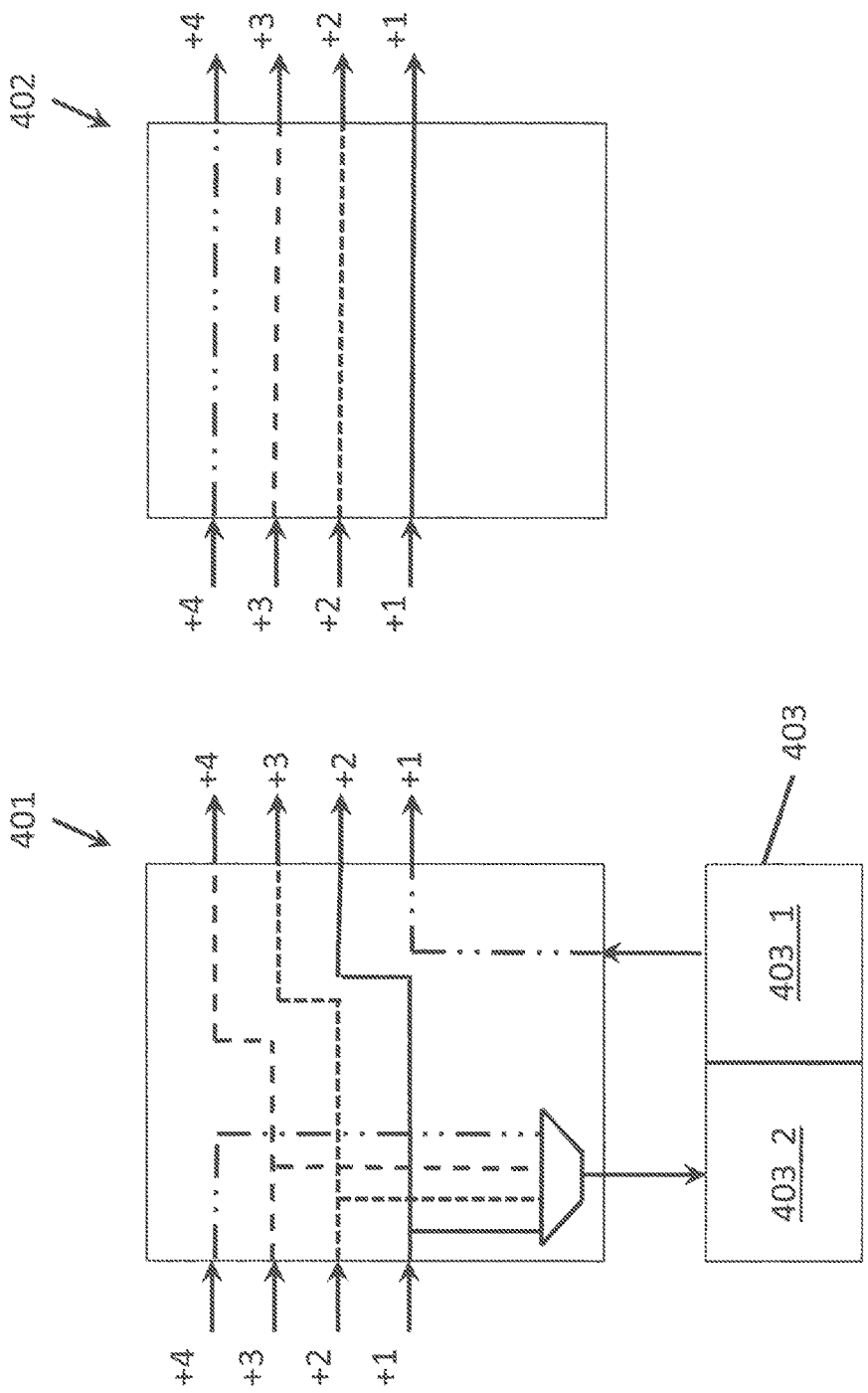

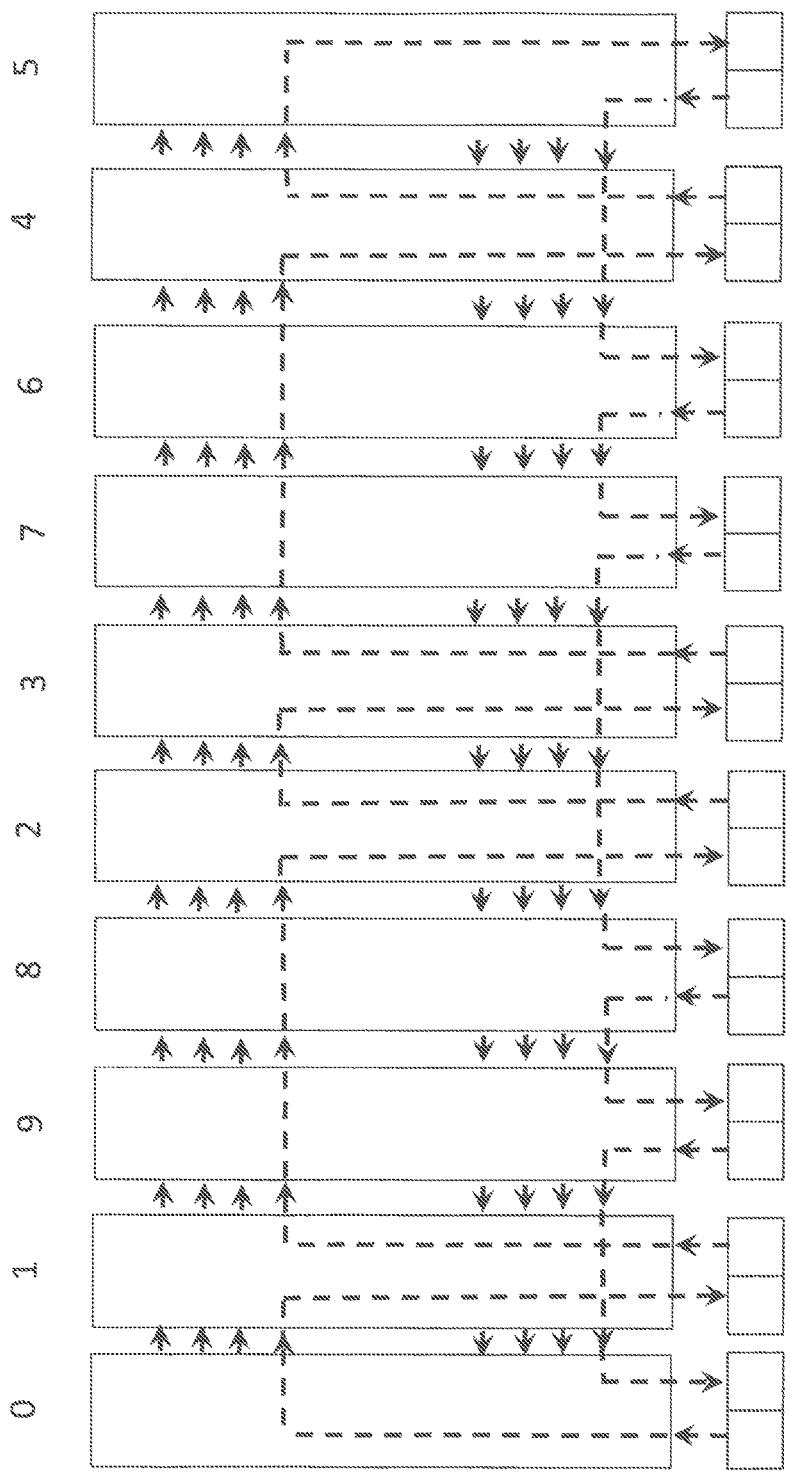

Fig. 11

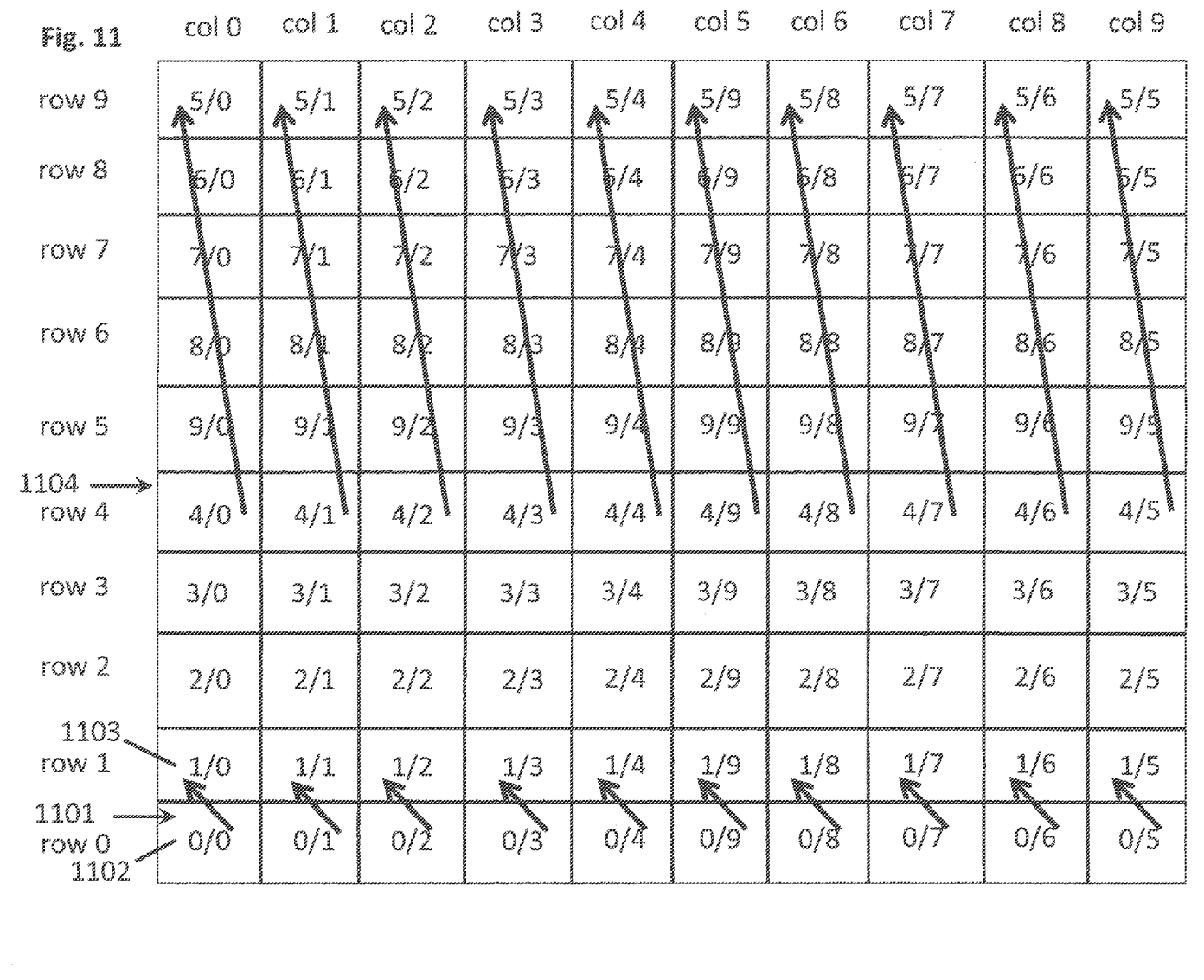

| | col 0 | col 1 | col 2 | col 3 | col 4 | col 5 | col 6 | col 7 | col 8 | col 9 |
|---|---|---|---|---|---|---|---|---|---|---|
| row 9 | 5/0 | 5/1 | 5/2 | 5/3 | 5/4 | 5/9 | 5/8 | 5/7 | 5/6 | 5/5 |
| row 8 | 6/0 | 6/1 | 6/2 | 6/3 | 6/4 | 6/9 | 6/8 | 6/7 | 6/6 | 6/5 |
| row 7 | 7/0 | 7/1 | 7/2 | 7/3 | 7/4 | 7/9 | 7/8 | 7/7 | 7/6 | 7/5 |
| row 6 | 8/0 | 8/1 | 8/2 | 8/3 | 8/4 | 8/9 | 8/8 | 8/7 | 8/6 | 8/5 |
| row 5 | 9/0 | 9/1 | 9/2 | 9/3 | 9/4 | 9/9 | 9/8 | 9/7 | 9/6 | 9/5 |
| 1104 → row 4 | 4/0 | 4/1 | 4/2 | 4/3 | 4/4 | 4/9 | 4/8 | 4/7 | 4/6 | 4/5 |
| row 3 | 3/0 | 3/1 | 3/2 | 3/3 | 3/4 | 3/9 | 3/8 | 3/7 | 3/6 | 3/5 |
| row 2 | 2/0 | 2/1 | 2/2 | 2/3 | 2/4 | 2/9 | 2/8 | 2/7 | 2/6 | 2/5 |
| 1103 → row 1 | 1/0 | 1/1 | 1/2 | 1/3 | 1/4 | 1/9 | 1/8 | 1/7 | 1/6 | 1/5 |
| 1101 → row 0 1102 | 0/0 | 0/1 | 0/2 | 0/3 | 0/4 | 0/9 | 0/8 | 0/7 | 0/6 | 0/5 | ns
SHIFT REGISTER WITH REDUCED WIRING COMPLEXITY

RELATED CASES

This application claims the benefit of U.S. Provisional Application No. 62/263,530, titled "Shift Register With Reduced Wiring Complexity", filed Dec. 4, 2015, which is incorporated by reference in its entirety.

FIELD OF INVENTION

The field of invention pertains generally to the computing sciences, and, more specifically, to a shift register with reduced wiring complexity

BACKGROUND

Image processing typically involves the processing of pixel values that are organized into an array. Here, a spatially organized two dimensional array captures the two dimensional nature of images (additional dimensions may include time (e.g., a sequence of two dimensional images) and data type (e.g., colors). In a typical scenario, the arrayed pixel values are provided by a camera that has generated a still image or a sequence of frames to capture images of motion. Traditional image processors typically fall on either side of two extremes.

A first extreme performs image processing tasks as software programs executing on a general purpose processor or general purpose-like processor (e.g., a general purpose processor with vector instruction enhancements). Although the first extreme typically provides a highly versatile application software development platform, its use of finer grained data structures combined with the associated overhead (e.g., instruction fetch and decode, handling of on-chip and off-chip data, speculative execution) ultimately results in larger amounts of energy being consumed per unit of data during execution of the program code.

A second, opposite extreme applies fixed function hard-wired circuitry to much larger blocks of data. The use of larger (as opposed to finer grained) blocks of data applied directly to custom designed circuits greatly reduces power consumption per unit of data. However, the use of custom designed fixed function circuitry generally results in a limited set of tasks that the processor is able to perform. As such, the widely versatile programming environment (that is associated with the first extreme) is lacking in the second extreme.

A technology platform that provides for both highly versatile application software development opportunities combined with improved power efficiency per unit of data remains a desirable yet missing solution.

SUMMARY

A shift register is described. The shift register includes a plurality of cells and register space. The shift register includes circuitry having inputs to receive shifted data and outputs to transmit shifted data, wherein: i) circuitry of cells physically located between first and second logically ordered cells are configured to not perform any logical shift; ii) circuitry of cells coupled to receive shifted data transmitted by an immediately preceding logically ordered cell comprises circuitry for writing into local register space data received at an input assigned an amount of shift specified in a shift command being executed by the shift register, and, iii) circuitry of cells coupled to transmit shifted data to an immediately following logically ordered cell comprises circuitry to transmit data from an output assigned an incremented shift amount from a shift amount of an input that the data was received on.

A cell of a shift register is described having means for receiving respective data items on respective inputs, where, the inputs are each assigned a different respective shift amount. The cell for the shift register also has means for writing into register space one of the data items received on one of the inputs having a shift amount specified by a shift command. The cell for the shift register also has means for transmitting others of the data items from respective outputs assigned an incrementally higher shift amount than those of the respective inputs the other data items were respectively received on, where, the incrementally larger shift amount is less than the shift amount specified by the shift command. The cell of the shift register also has means for reading a data item from register space and transmitting the read data item from an output assigned a shift amount having a magnitude of 1.

FIGURES

The following description and accompanying drawings are used to illustrate embodiments of the invention. In the drawings:

FIG. 2b shows a closed loop shift register having cells that are not laid out in strict logical order and that supports different shift amounts in a single cycle;

FIG. 4 shows unit cell designs for the supporting logic circuitry of the cells of the shift register of FIG. 3;

FIG. 6 shows a shift operation by a shift register having a different physical lay out than the shift register of FIGS. 5a, 5b and 5c;

FIG. 11 shows coupling between horizontal and vertical shift registers of a two-dimensional shift register;

DETAILED DESCRIPTION

Figure 1:
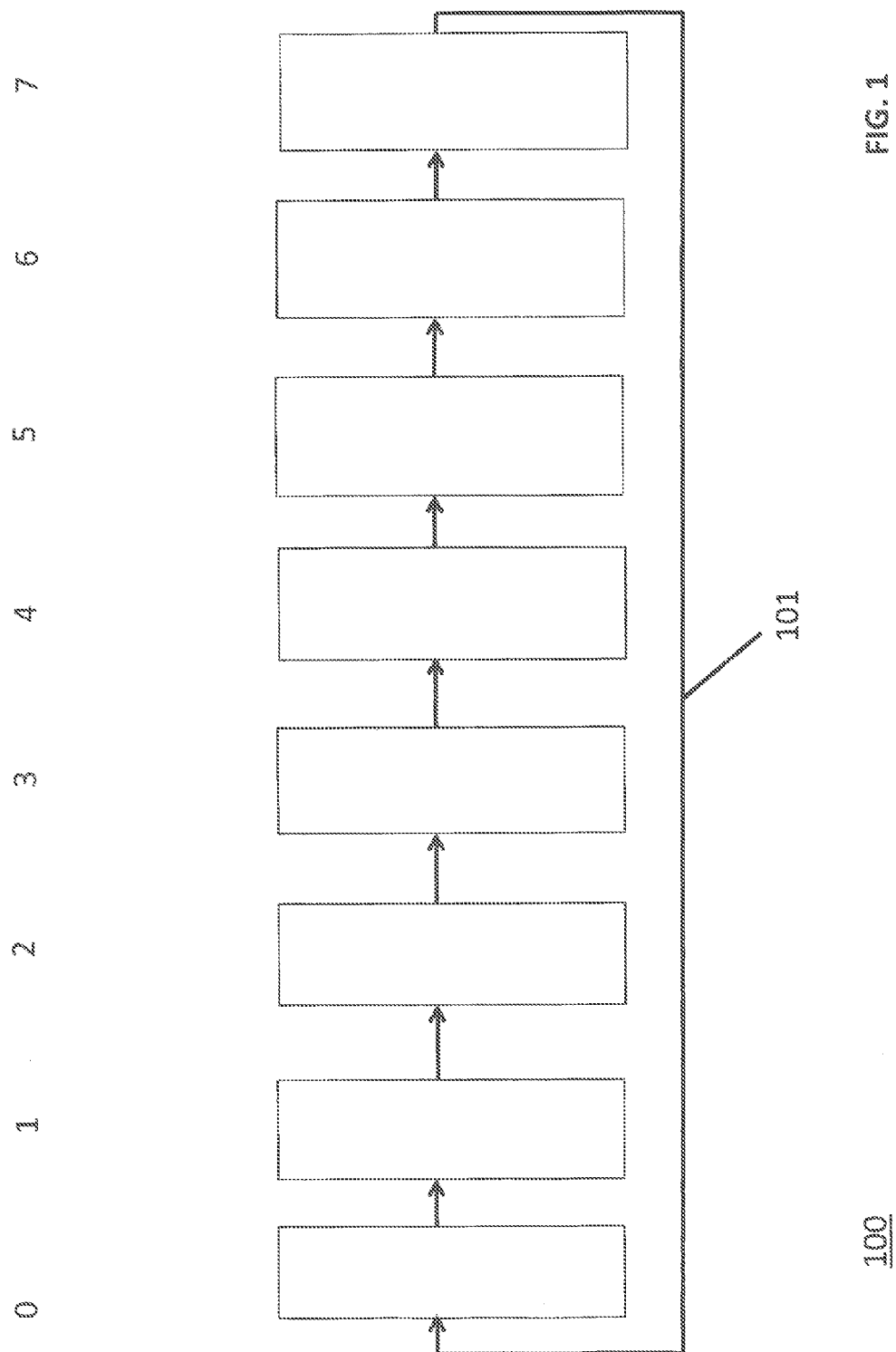
FIG. 1 shows a closed loop shift register.

FIG. 1 shows an exemplary closed loop shift register circuit 100 having a dimension of eight. Here, unique data is stored in each of the eight cells. Upon a shift command the content of each register will shift one cell "to the right" for all cells except the eighth cell which rolls it content back to the first cell. That is, cell 0 will shift its content into cell 1, cell 1 will shift its content into cell 2, etc. and cell 7 will shift its content into cell 0.

FIG. 1 depicts an exemplary physical layout of the shift register. As observed in FIG. 1, the cells are physically laid out in logical order. That is, cell 0 is physically located next to cell 1, cell 1 is physically located next to cell 2, etc. A problem with physically laying out the cells in logical order is the length of wire 101. Here, as is understood in the art, longer wires correspond to more resistance and capacitance and therefore slower propagation delay for a given drive strength (or conversely, more power consumption by the output driver of cell 7 if it is to drive wire 101 with the same propagation delay as the shorter length wires between the other cells). Here, the signal wires are RC dominated. As such the delay is linearly proportional with distance once repeaters are inserted. Assuming wire 101 has a more lengthy propagation delay than the shorter wires between the other cells, the performance of the shift register 100 is limited by wire 101 even though cells 0 through 6, having much shorter output wires, can shift their content to their neighboring cell much faster than cell 9 can shift its content into cell 0.

Figure 2A:
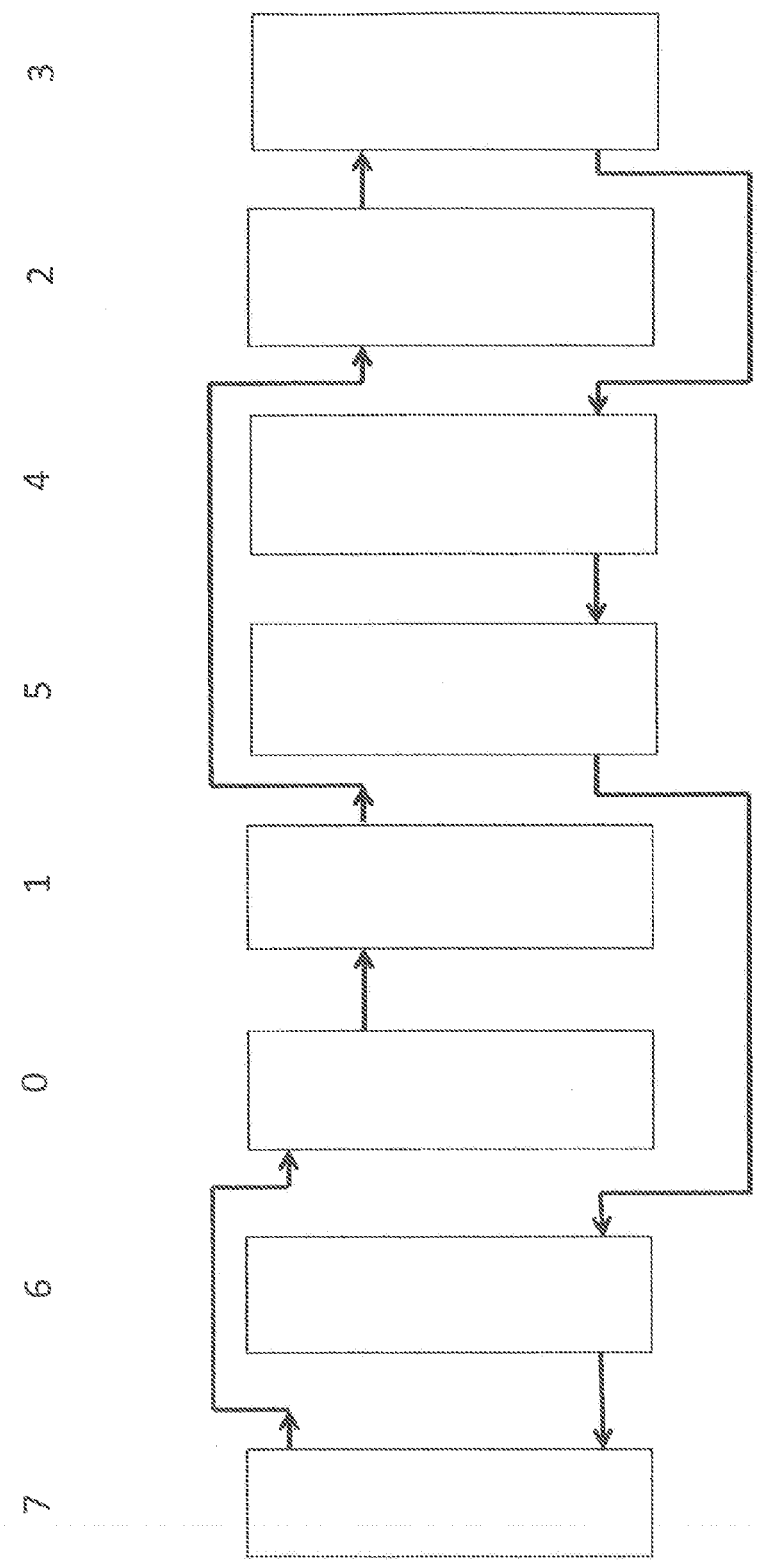
FIG. 2a shows a closed loop shift register having cells that are not laid out in strict logical order.

A solution to the problem described just above is to physically layout the cells of the shift register in a different order than their logical order. FIG. 2a demonstrates this approach for the shift register of FIG. 1. As observed in FIG. 2a, cell 1 is physically located next to cell 5. By physically laying the cells out in a different order than their logical order, the longest wires in the shift register of FIG. 2a are shorter than the wire 101 of FIG. 1, which, in turn, corresponds to potentially better performance by the shift register of FIG. 2a as compared to the shift register of FIG. 1.

Both shift registers of FIGS. 1 and 2a only depict a +1 shift register (the shift register is only capable of shifting data content a distance of one logical unit cell to the right. FIG. 2b shows the shift register of FIG. 2a if it is further designed to support +2 shifts as well as +1 shifts. That is, in a single cycle, any cell of the shift register of FIG. 2b can shift its content into its either its next logical neighbor or its second next logical neighbor.

For example, from the direct wiring of FIG. 2b, cell 0 can shift its content into cell 1 (via wire 201), or cell 2 (via wire 202). A problem however with the direct wiring approach of FIG. 2b is the wiring complexity. Simply stated, comparing FIGS. 2a and 2b, by merely introducing one more logical shift, a significant number of longer wires are introduced to the circuit of FIG. 2b than the circuit of FIG. 2a. The wiring complexity problem compounds itself for larger dimension shift registers (in terms of the number of unit cells) and/or shift registers that support a wider range of logical shifts (e.g., +1, +2, +3 and +4). With r registers, to support a shift of +n, the approach of FIG. 2b will require r*n wires with the longest wire being 2*(n−1) unit lengths.

Thus, a better shift register design is needed, e.g., for large dimension shift registers having a wide range of logical shift options where higher performance and reduced power consumption is desirable.

Figure 3:
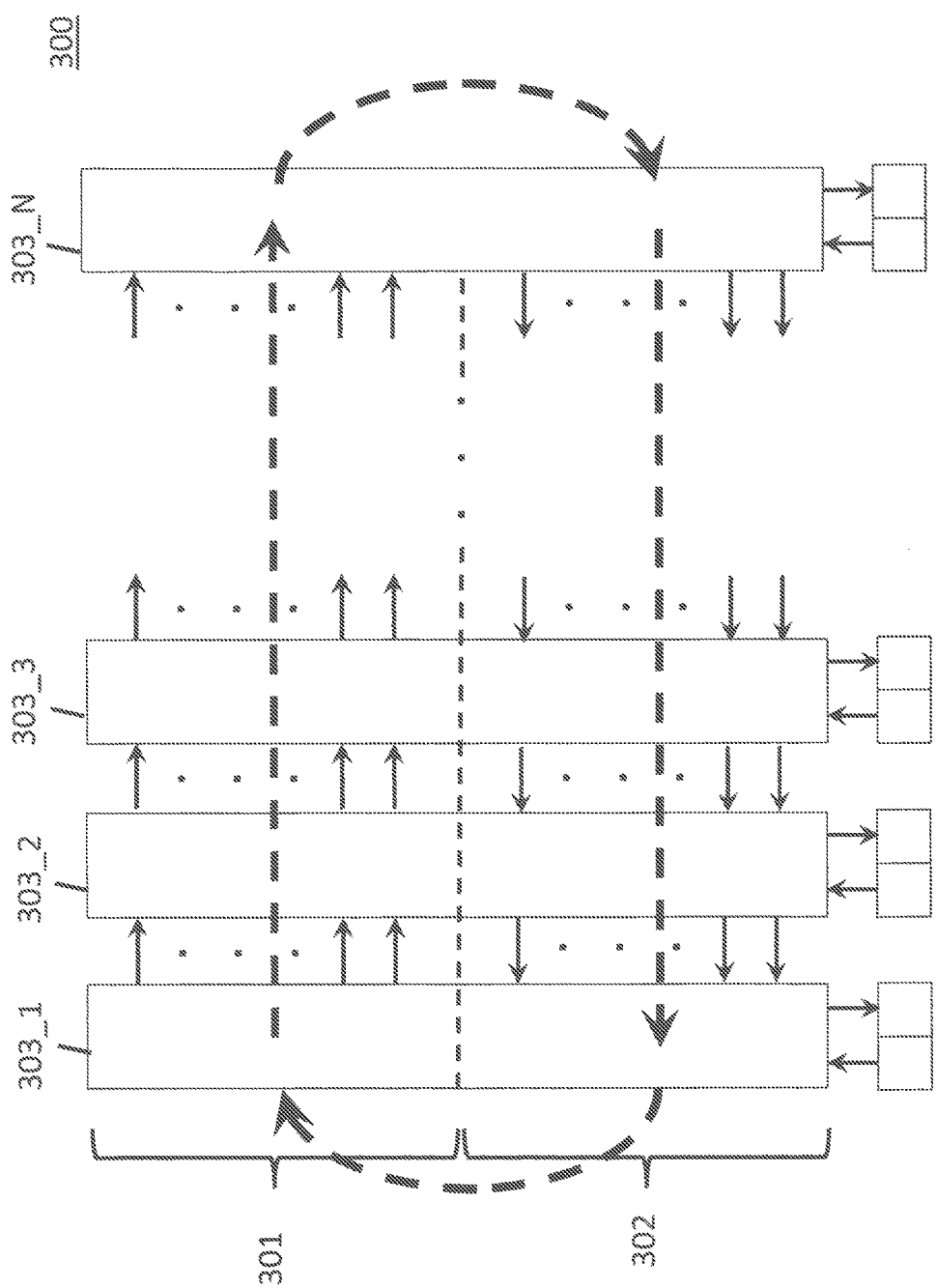
FIG. 3 shows an architecture for an improved shift register that supports different shift amounts in a single cycle.

FIG. 3 shows a physical architecture of an improved shift register design 300. As observed in FIG. 3, the shift register 300 can be viewed as unit cells whose supporting logic has an upper portion 301 and a lower portion 302. Logical and physical shifts occur in one direction in a "loop" around the shift register. In various embodiments, the upper portion 301 can be envisioned to physically shift in one direction (e.g. to the right) while the lower portion 302 can be envisioned to physically shift in another direction (e.g., to the left) while all logical shifts are in a same direction (e.g., positive or "+"). As observed in FIG. 3, the respective logic circuitry 303_0 through 303_N that supports each unit cell can perform shifting in both physical directions.

FIG. 4 shows unit cell logic circuit designs 401, 402 for the supporting logic circuitry 303_1 through 303_N of FIG. 3. Each unit cell logic design 401, 402 of FIG. 4 is capable of supporting shifting in one direction. As such, each instance of supporting logic 303_1 through 303_N of the shift register of FIG. 3 has two instances of unit cell logic selected from the unit cell logic designs 401, 402 of FIG. 4 (i.e., one selected unit cell logic design for each direction, or, said another way, one selection for the upper portion and one selection for the lower portion).

As described in more detail further below, which specific unit cell logic design is selected for any particular direction/portion of any particular unit cell's supporting logic is a function of the physical layout location of each cell relative to the overall logical relationship amongst the unit cells of the shift register. Thus, depending on their logical identifier and physical location within the shift register, some unit cells may have two instances of unit cell 401, while other unit cells may have two instances of unit cell 402 while yet other unit cells may have one instance of unit cell 401 and one instance of unit cell 402. As just an example, the unit cells 401, 402 of FIG. 4 are for a shift register that can perform +1, +2, +3 and +4 logical shifts. Other shift amount schemes are possible while still conforming to the overall design approach as described at length below.

The two unit cells of FIG. 4 include a shifting unit cell 401 and a non-shifting (or "straight-through") unit cell 402. The shifting unit cell 401 receives input data content from a neighboring cell. Here, each input represents an amount of logical shift that has already been applied to the data that is received at the input. For instance, data received at the +1 input has been logically shifted once upon its reception at the shifting unit cell 401, data received at the +2 input has been logically shifted twice upon its reception at the shifting cell 401, data received at the +3 input has been logically shifted upon its reception it is at the shifting cell 401 and data received at the +4 input has been logically shifted four times upon its reception at the shifting cell 401.

The shifting cell 401 also has outputs that indicate how much the data being transmitted has been shifted as of the moment it is transmitted from the shifting cell 401. That is, the +1 output corresponds to data that has been shifted once at the moment it is transmitted by the shifting cell 401, the +2 output corresponds to data that has been shifted twice as of the moment it is transmitted by the shifting cell 401, the +3 output corresponds to data that has been shifted three times as of the moment it is transmitted by the shifting cell 401, and the +4 output corresponds to data that has been shifted four times as of the moment it is transmitted by the shifting cell 401.

By definition, data that is transmitted at the +1 output is read from the unit cell's local register space 403. That is, data that is read from the local register 403 and sent from the unit cell 401 to a next cell is shifted by +1 as of the moment it is transmitted. As such, the +1 output is coupled to the local register space 403 of the shifting unit cell 401. Similarly, data that is transmitted from the +2 output must have been already shifted by +1 as of the moment it was received by the shifting unit cell 401. As such, the +2 output is directly fed by the +1 input. For similar reasons, the +3 output is directed fed by the +2 input and the +4 output is directly fed by the +3 input.

The treatment the shifting cell applies to the input data depends on the shift amount command (e.g., +1, +2, +3, +4). For inputs that correspond to a shift amount that is less than the shift command (e.g., the input data is received at the +1 input and the shift command is +3), the shifting cell 401 retransmits the input data on a next higher shift output (e.g., for a +3 shift command, data is read from the local register 403 and transmitted at the +1 output, data received at the +1 input is transmitted from the +2 output and data received at the +2 input is transmitted from the +3 output). For input data that is received at an input having the same shift amount as the shift command (e.g., input data that is received at the +3 input and the shift command is +3), the unit cell stores the input data in its local register space 403. As will become evident from the discussion below, inputs and outputs having a shift amount greater than the shift command are naturally not used by the cells (e.g., for a +3 shift command, no data appears at a +4 input or +4 output of any cell).

The local register space 403, in an embodiment, is twice the width of the data and has shifting capability within itself. Here, during a first time frame (e.g., a first half cycle), data is read from a "first" half of the register space 403_1 and data is propagated through the shift register amongst the unit cells along their appropriate input/output paths. During a second time frame (e.g., a second half cycle) data is written into a "second" half of the register space 403_2, at each unit cell locally. Which portion of register space 403 is read from (i.e., which half is the "first" half) and which portion is written to (i.e., which half is the "second" half) toggles between consecutive cycles. According to this process, shifts of various amounts (e.g., +1, +2, +3 and +4) can each occur in a single cycle. It is pertinent to note however that other approaches to implement the register space may be used. For example, in another embodiment a flop based multi-port register file may be used where all data is read or updated on a clock edge. Still other possible embodiments may exist.

The straight-through cell 402 is used to permit physical layout of the cells in an order other than logical order without disrupting the scheme of assigning certain shift amounts to certain inputs/outputs of the shifting cells. That is, correct logical shift order is preserved by the straight through unit 402 by feeding each output node with the same shift amount as received at an input node. Thus, if two shifting unit cells in logical order have one or more other cells physically between them, these other cells have straight-through cells to preserve the correct shift amount as transmitted at the outputs of the transmitting unit cell and as received at the inputs of the receiving shifting unit cell.

Figure 5A:
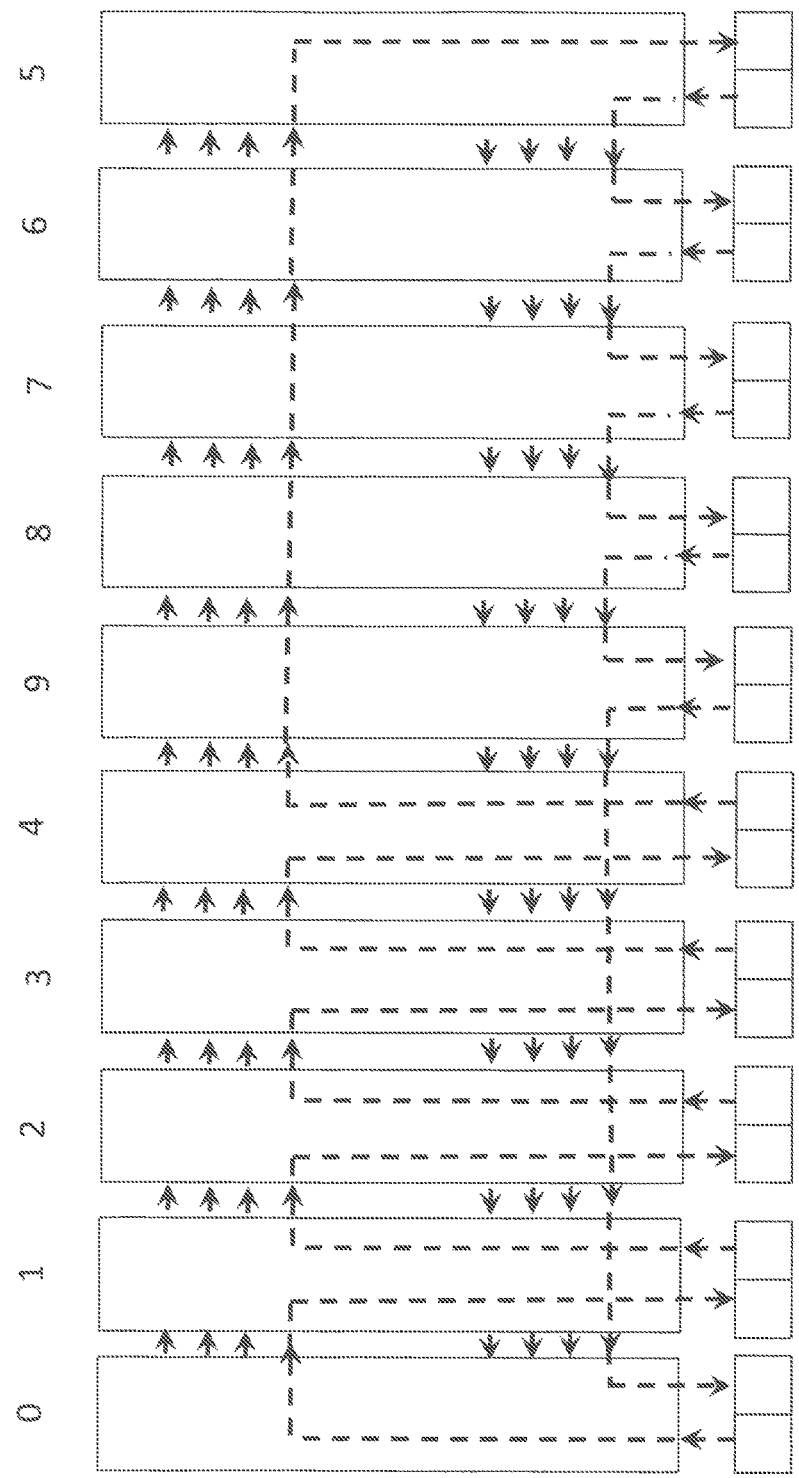
FIGS. 5a, 5b and 5c show different shift operations by a shift register.
Figure 5B:
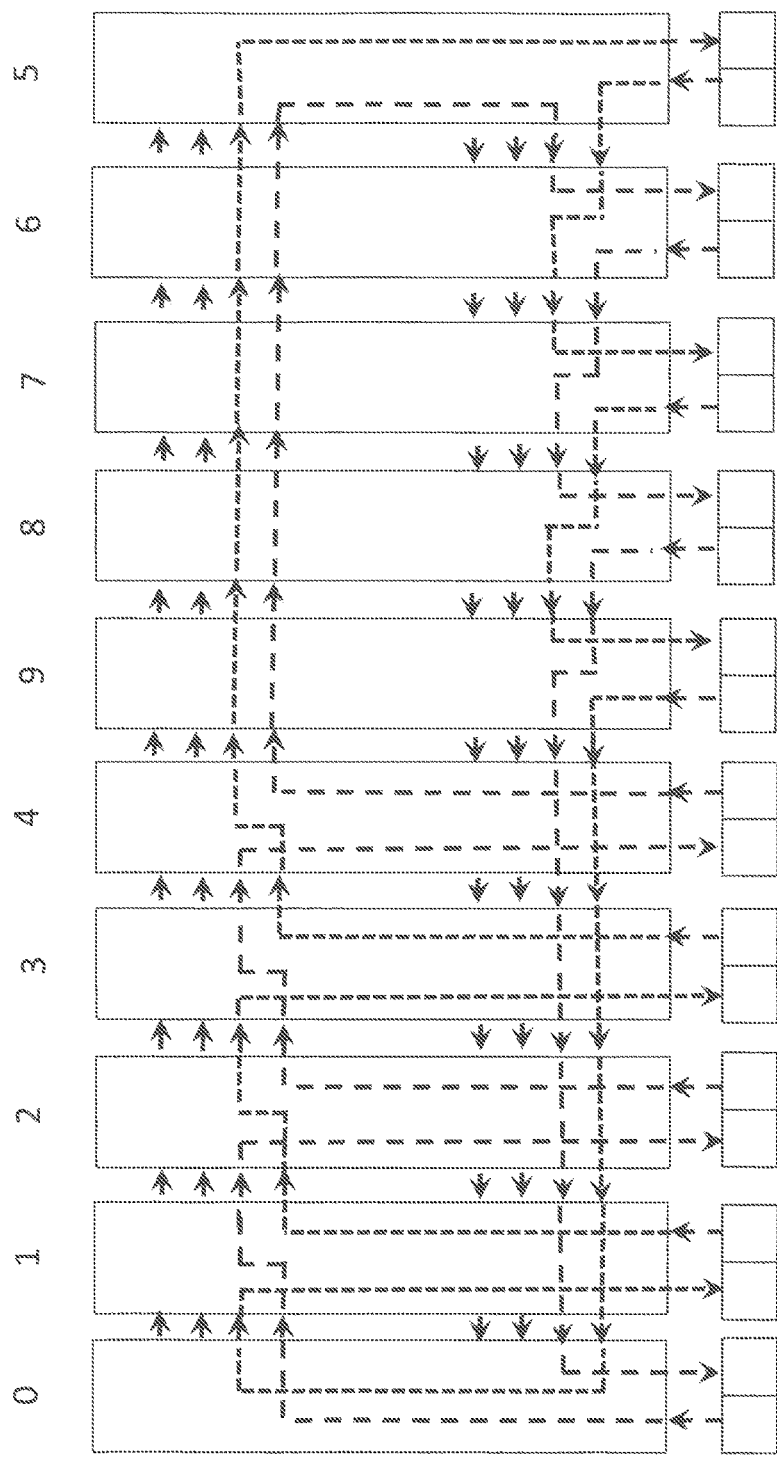
Figure 5C:
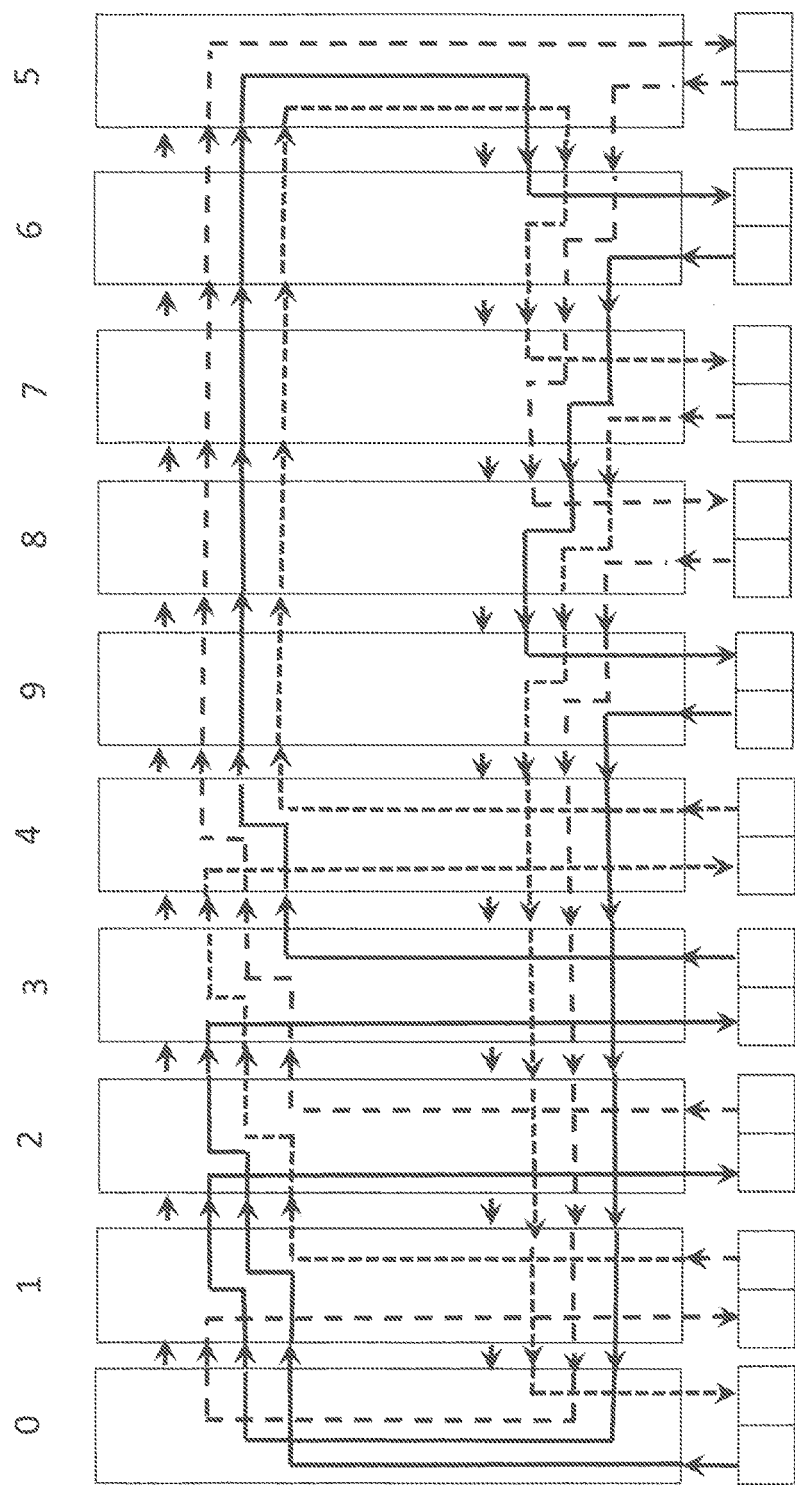

FIGS. 5a through 5c explore the data paths established by a shift register of dimension ten that supports shifts of +1, +2, +3 and +4. Consistent with the above discussion, the supporting logic circuitry for each of the cells can be viewed as having an upper half having four inputs and four outputs that shifts data in one direction ("to the right") and a lower half also having four inputs and four outputs that shifts data in another direction ("to the left"). Note that the cells are physically laid out in an order other than pure logical order (not every cell is physically next to its logically ordered neighbors).

As will be clear from the following discussion, the supporting logic circuitry of unit cells 1, 2, 3 and 4 have a shifting unit cell in its upper half and a straight through unit cell in its lower half. By contrast, the supporting logic for unit cells 9, 8, 7, 6 have a straight through unit cell in its upper half and a shifting unit cell in its lower half. Unit cell 5 is composed of the receive portion of a shifting unit cell in its upper portion and the transmit portion of a shifting unit cell in its lower portion. Unit cell 0 is composed of the receive portion of a shifting unit cell in its lower portion and the transmit portion of a shifting unit cell in its upper portion. For both cells 0 and 5, the inputs of the receive portion are wired to the transmit portion consistently with the design of the shifting unit cell 401.

FIG. 5a shows the operation of a +1 shift. Here, with cells 1 through 4 each being physically next to its logical order neighbor on its receive side, the upper portion of each cell will directly receive data from its correct logical neighbor. As such, as mentioned above, the upper portion of cells 1 through 4 is observed to implement the correct shifting function for a +1 shift. That is, the upper portion of each of cells 1 through 4 receives data at its +1 input and stores it in its local register space. Additionally, each of unit cells 1 through 4 reads data from its local register spaces and transmits it from its +1 output.

Unit cells 4 and 5 are physically separated by unit cells 9, 8, 7 and 6. As such, the upper half of unit cells 9, 8, 7 and 6 are observed to perform a straight through function. Because the upper half of unit cells 9, 8, 7 and 6 perform a straight through function unit cell 5 receives the data transmitted by unit cell 4 at inputs that reflect the correct shift amount (i.e., at its +1 input). As such, the upper portion of unit cell 5 is observed to execute the receive side function of a shifting unit cell. The lower portion of unit cell 5 executes the transmit side function of a shifting unit cell. Execution of the lower portion of the entire shift register is the same as the upper portion but in a different direction (except that unit cell 0 executes a receive side shifting cell function in its lower portion and a transmit side shifting unit cell function in its upper portion). Note that only +1 inputs and outputs are used by the unit cell logic for all cells. That is, the +2, +3 and +4 inputs and outputs for all unit cells do not transport any data.

FIG. 5b shows the same shift register performing a +2 shift. Here, again, the upper portion of cells 1 through 4 are observed to perform the shifting unit cell function for a +2 shift. Each unit of these cells locally stores the data it receives at its +2 input, transmits the content of its local register from its +1 output, and transmits the data it receives at its +1 input from its +2 output. Here, note that +1 and +2 data inputs and outputs are being utilized by the cells, but +3 and +4 inputs and outputs are not used. Similarly, the straight through function performed by the upper portion of unit cells 9, 8, 7 and 6 utilize both +1 and +2 inputs and outputs. As before, end unit cell 5 performs a +2 receive side shifting unit cell function in its top portion and a +2 transmit shifting unit cell function at its bottom portion. Likewise, end unit cell 0 performs a +2 receive side shifting unit cell function in its lower portion and a +2 transmit shifting unit cell function at its top portion.

FIG. 5c shows the same shift register performing a +3 shift. The upper portion of cells 1 through 4 are observed to perform the shifting unit cell function for a +3 shift. Each of these cells locally stores the data it receives at its +3 input, transmits the content of its local register from its +1 output, transmits the data it receives at its +1 input from its +2 output and transmits the data it receives at its +2 input from its +3 output. Here, note that +1, +2 and +3 data inputs and outputs are being utilized by the unit cells, but +4 inputs and outputs are not used. The straight through function performed by the upper portion of unit cells 9, 8, 7 and 6 utilize the +1, +2 and +3 inputs and outputs. As before, end unit cell 5 performs a +3 receive side shifting unit cell function in its upper portion and a +3 transmit shifting unit cell function at its lower portion. Likewise, end unit cell 0 performs a +3 receive side shifting unit cell function in its lower portion and a +3 transmit shifting unit cell function at its upper portion.

FIG. 6 shows another dimension ten shift register designed according to the same principles described above except that the physical layout is different. Here, instead of sets of five cells being laid in logical order and sets of five neighboring straight through cells (as with the design of FIGS. 5a through 5c), by contrast, the design of FIG. 6 has sets of two cells laid out in logical order and sets of two neighboring straight through cells. FIG. 6 shows a +1 shift being performed by the shift register of FIG. 6.

Comparing the shift register of FIG. 5a with the shift register of FIG. 6, note that the shift register of FIG. 5a can be characterized as having a larger number of the shortest possible distance hops (there are 8 hops of one cell distance in FIG. 5a) than the shift register of FIG. 6 (there are 4 hops of one cell distance in FIG. 6). Additionally, the shift register of FIG. 5a has a longer maximum distance hop than the shift register of FIG. 6 (the shift register of FIG. 5a has a maximum hop distance of 5 cells while the shift register of FIG. 6 has a maximum hop distance of 3 cells).

As such, the shift register of FIG. 6 should be faster than the shift register of FIG. 5b. A general principle or property of the circuit is that cells can be physically grouped in logical order up to the maximum shift amount of the register before the delay (distance) increases. The shift register of FIG. 5a physically groups cells in logical order in an amount (5) that is greater than the maximum shift register amount (4) while the shift register of FIG. 6 does not. As such, again, the circuit of FIG. 6 should be faster than the circuit of FIG. 5a.

Figure 7:
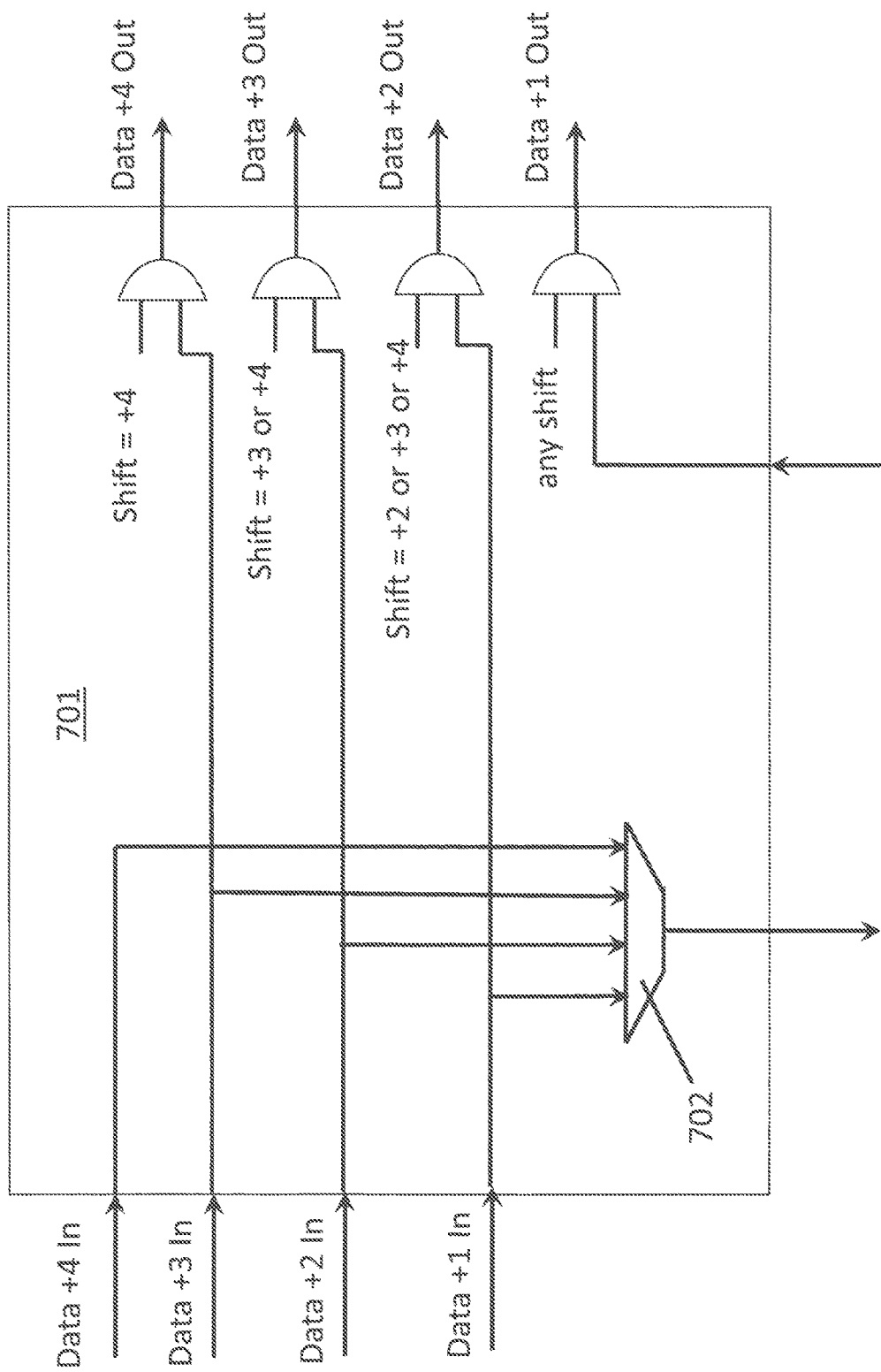
FIG. 7 shows a shifting unit cell logic circuit design.

FIG. 7 shows an embodiment 701 of the logic design for a shifting unit cell 401. Here, a multiplexer 701 selects which shifted input to write to its local register space based on the shift command. That is, the amount of shift specified by the shift command is directed to the channel select input of multiplexer 701. The circuit also makes use of internal control signals, a first of which indicates whether any shift is taking place (+1, +2, +3 or +4) and which is used to enable the +1 output. A second internal control signal indicates whether a +2, +3 or +4 shift is taking place and is used to enable the +2 output. A third internal control signal indicates whether a +3 or +4 shift is taking place and is used to enable the +3 output. A fourth internal control signal indicates whether a +4 shift is taking place and is used to enable the +4 output. The data paths are understood to be multi-bit data paths so that wide data words can be transported along them.

Figure 8:
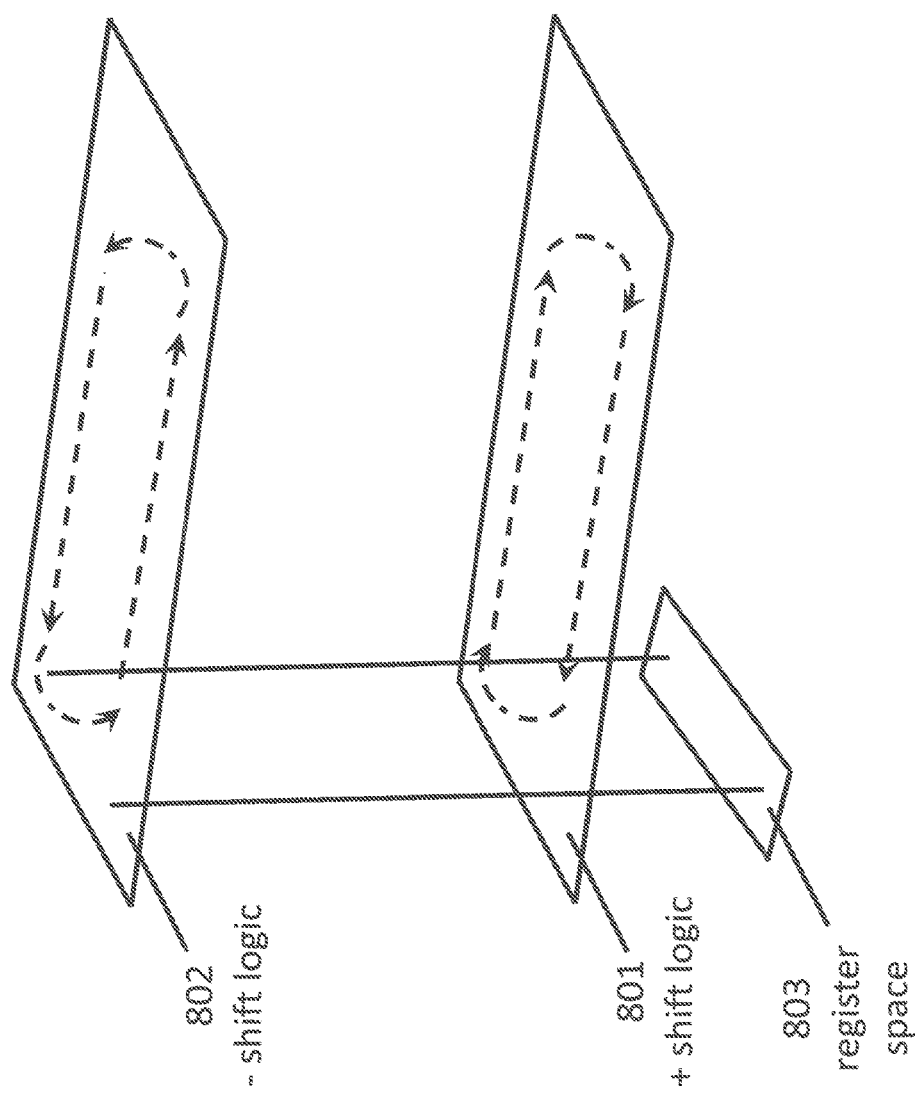
FIG. 8 shows a bi-directional shift register.

The discussions above have focused on a shift register that shifts in one direction (+, or "to the right"). FIG. 8 shows a high level view of a bi-directional register that can shift in both directions (+ to the right and − to the left). Here, the bi-directional shift register is implemented by constructing the supporting unit cell logic 801 for a + shift register and constructing the supporting unit cell logic 802 for a − shift register and coupling the same logical cells for both directions to a same register space 803 (for simplicity FIG. 8 only shows the coupling for one cell). The logic design for the + shift register 801 is, e.g., the same as described above for FIGS. 5a-c and 6, while the logic design for the − shift register 802 is also the same as described above for FIGS. 5a-c except that shift and data flow directions are in a counter clockwise direction rather than a clockwise direction. To implement a + shift the + logic 801 is used and the − logic is not used. To implement a − shift the − logic 802 is used and the + logic 801 is not used. As such, shifts in either direction are possible without additional wiring resources being consumed. That is, wires are shared between the + shift and − shift directions. For example, the Data +4 Out wire of FIG. 7 can also be used to implement the bypass wire for the Data −4 In wire for the same unit cell. As such, the present design allows for significant wiring reduction efficiencies.

Figure 9:
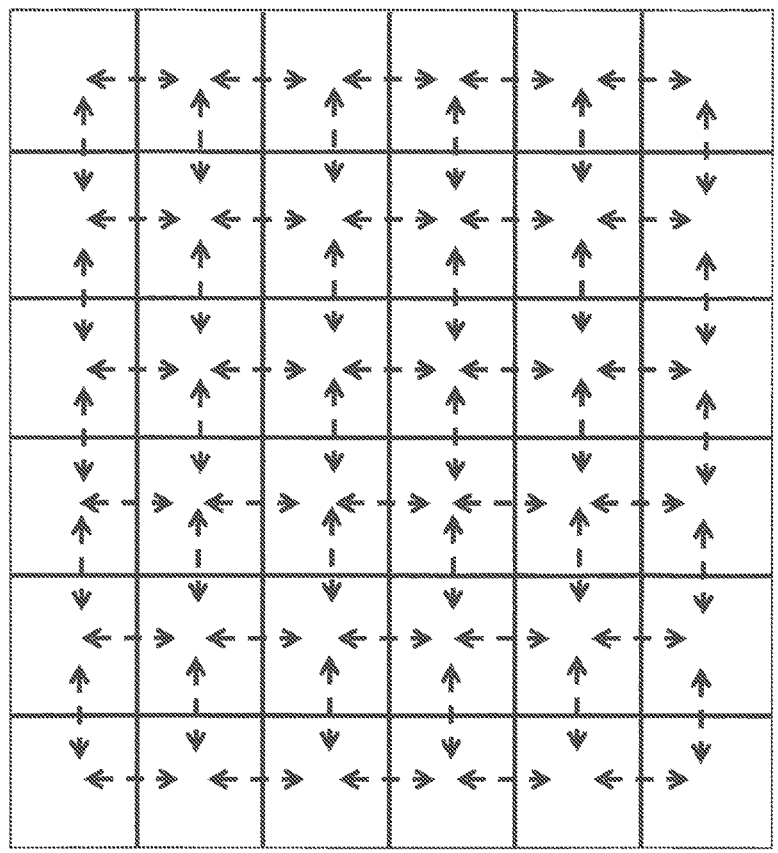
FIG. 9 shows a two-dimensional shift register array.

FIG. 9 shows a two-dimensional shift register array 900. As observed in FIG. 9 the two-dimensional shift register array includes a number or rows of registers that effectively form a two-dimensional array of registers. The arrows between cells show that the two-dimensional register array is capable of shifting to the right, left, up, or down (for ease of drawing loopback capability along any row or column is not depicted although it may exist). As such, the two-dimensional shift register array may support shift commands of the form SHIFT (+/−X; +/−Y) where X corresponds to a shift amount along a row axis, Y corresponds to a shift amount along a column axis, and the polarity (+ or −) indicates the direction of shift along either axis (left or right along a row axis and up or down along a column axis). A two-dimensional shift register may be implemented in, e.g., an image process as described at length further below.

Figure 10:
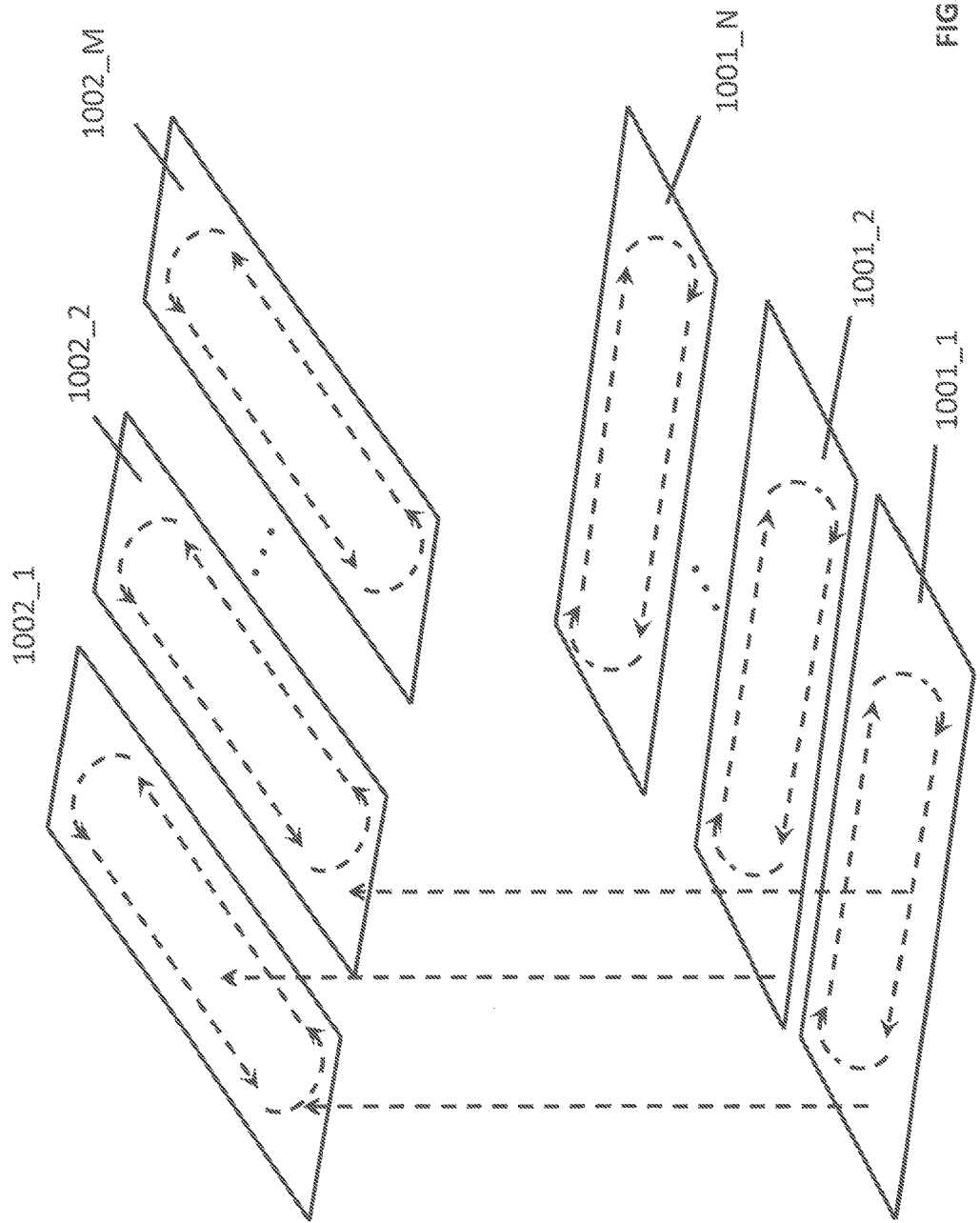
FIG. 10 shows a design for a two-dimensional shift register array that uses shift registers of the instant application.

FIG. 10 shows a high level view of two dimensional shift register constructed from the basic shift register design described at length above with respect to FIGS. 3 through 6. Here, logic circuitry instances 1001_1 through 1001_N respectively implement the unit cell logic circuitry for a shift register along a particular row axis where each shift register implements the shift register design principles discussed above. Circuitry 1001_1 corresponds to the logic circuitry used to implement a shift register along a first row, circuitry 1001_2 corresponds to the logic circuitry used to implement a shift register along a second row, etc. For ease of drawing, the circuitry only indicates shift capability in one direction, however, each of instances 1001_1 through 1001_N may implement bi-directional shift capability consistent with the principles described above with respect to FIG. 8.

Similarly, logic circuitry instances 1002_1 through 1002_M respectively implement the unit cell logic circuitry for a shift register along a particular column axis where each shift register implements the shift register design principles discussed above. Circuitry 1002_1 corresponds to the logic circuitry used to implement a shift register along a first column, circuitry 1002_2 corresponds to the logic circuitry used to implement a shift register along a second column, etc. Again, for ease of drawing, the circuitry only indicates shift capability in one direction, however, each of instances 1002_1 through 1002_N may implement bi-directional shift capability consistent with the principles described above with respect to FIG. 8.

Note that the circuitry instances 1001, 1002 of FIG. 10 depict the logic circuitry used to implement the cells of a shift register with circuitry 1001 representing horizontal shift capability and circuitry 1002 representing vertical shift capability. Horizontal shift and vertical unit cell shift circuits associated with a same array cell are coupled to same register space. To implement a horizontal shift, horizontal shift circuits 1001_1 through 1001_M are used to effect horizontal shifting along all rows and to implement a vertical shift, vertical shift circuits 1002_1 through 1002_M are used to implement a vertical shift along all columns.

An issue with implementing the two-dimensional shift register is coupling the horizontal shift circuitry 1001 to the vertical shift circuitry 1002 so that, e.g., a horizontal shift and a vertical shift can be performed with a single command (e.g., SHIFT (+3, +4)). FIG. 11 shows the physical layout of a 10×10 two-dimensional shift register array where each row register circuit implements the physical cell layout of FIGS. 5a through 5c and each column register circuit implements the physical layout of FIGS. 5a through 5c. Here, cells of the array contain a numeric syntax of the form Q/R where Q represents the vertical logical cell assignment and R represents the horizontal logical cell assignment (the "row" and "col" labels that appear along the left and top edges of FIG. 11 correspond to physical rows and columns). As such, looking at just the R values across any row, the cell pattern of FIGS. 5a through 5c is recognizable. Additionally, looking at just the Q values across any column, the cell pattern of FIGS. 5a through 5c is also recognizable.

If only a horizontal shift is required, data shifts occur only along a row (only circuitry instances 1001 of FIG. 10 are used). If only a vertical shift is required, data shifts occur only along a column (only circuitry instances 1002 of FIG. 10 are used). If both a horizontal and vertical shift is to take place, data units need to be correctly shifted, e.g., in an implementation that first shifts horizontally and then shifts vertically, from a particular row to the correct logical vertical cell. For instance, all cells along row 0 are recognized as being within vertical logical cell 0 (each of their R value is 0). In order to perform a shift up of +1, the content of each cell of row 0 needs to be shifted into a cell having a vertical logical value of 1 (i.e., the contents need to be shifted into cells each having a Q value of 1). Arrows 1101 therefore show the physical wiring that logically performs the correct shift.

Figure 12:
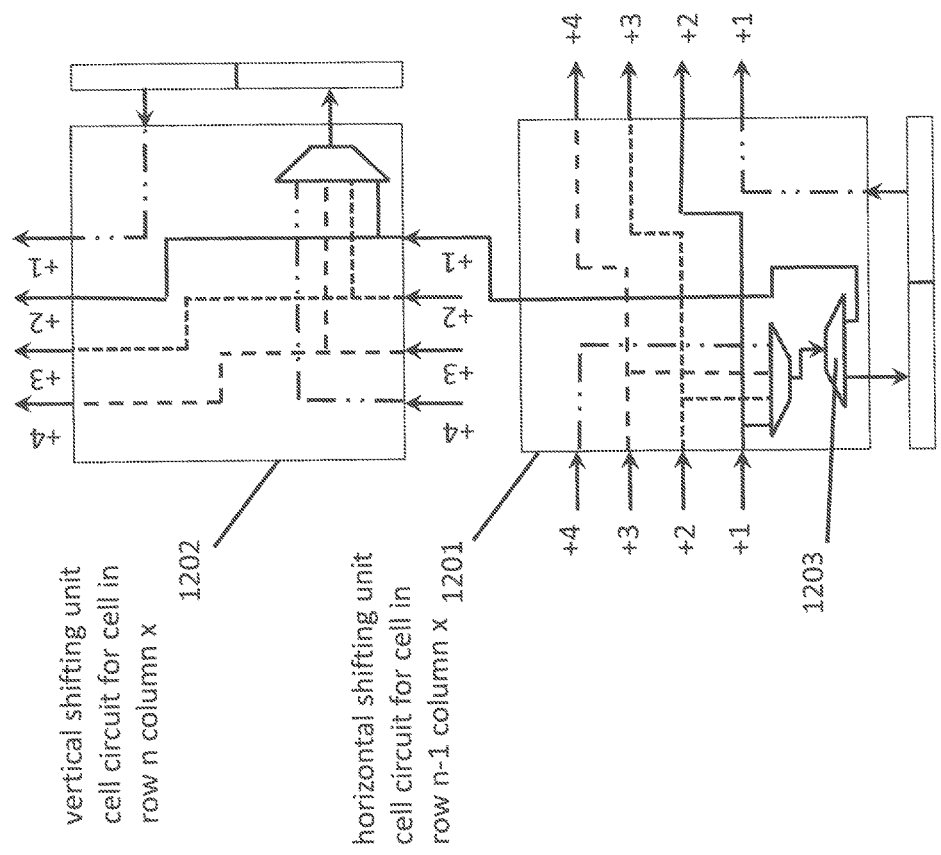
FIG. 12 shows coupling between horizontal and vertical shift register unit cell circuits of a two-dimensional shift register.

FIG. 12 shows an example of the coupling between horizontal shift logic and vertical shift logic. Here, for example, shifting unit cell 1201 corresponds to the horizontal shift logic for any cell of row 0 in FIG. 11. Shifting unit cell 1202 therefore corresponds to the vertical shift logic of the cell that the horizontal shift logic 1201 shifts into in order to translate data shifting from horizontal movement to vertical movement. In this particular example, vertical shift logic 1202 corresponds to the vertical shift logic in the same column as the horizontal shift logic 1201 but having a logical vertical value of 1 (i.e., having a Q value of 1). Thus, for instance, circuit 1201 corresponds to the horizontal shift circuit for the cell 1102 of FIG. 11 and circuit 1202 corresponds to the vertical shift circuit for cell 1103 of FIG. 11.

The act of the shift from the horizontal dimension to the vertical dimension corresponds to a horizontal shift of +1. Thus, the data is received at the +1 input of the next higher vertical logical valued cell (e.g., from cell 1102 having a Q value of 0 to cell 1103 having a Q value of 1). Once data has been shifted into the vertical shifting circuitry at the +1 input, operation of the vertical shifting circuit operates as described at length above (e.g., if a +2 vertical movement is required, the +1 vertically shifted data will be shifted up to the +2 signal line and written into the next logically higher cell's register.

The horizontal to vertical coupling will resemble coupling 1101 for each of rows 0 through 3 of FIG. 11. Coupling 1104, by contrast is longer because the coupling from logical Q values of 4 to logical Q values of 5 requires a jump from row 4 to row 9. Note the presence of multiplexer 1203 in FIG. 12. Here, according to an embodiment, horizontal shifts are performed before vertical shifts for any shift command. Upon the completion of all horizontal shifting to satisfy the shift command, if no vertical shift is specified in the command, multiplexer 1203 enables the channel that writes to the local register of the horizontal shift circuit 1201. By contrast, if the command specifies a vertical shift, upon completion of all horizontal shifting specified by the shift command, multiplexer 1203 enables the channel that routes the data up to vertical shifting circuit 1202. If a vertical shift of only +1 is specified, the data is written into the local register space of shift circuit 1202. If more vertically shifting is specified, the data that was shifted from unit cell 1201 to unit cell 1202 is transmitted from the +2 output of unit cell 1202.

It is pertinent to note that circuit descriptions of the shift register for use in an EDA compiler (e.g., an RTL description for use in a synthesis tool) may be broken into two separate shift registers to avoid glitches in the synthesis process of the overall shift register. For example, a first shift register may be described as, e.g., as the aforementioned upper portion of the shift register of FIGS. 5a-5c with transmit side shifting unit cell circuitry on a source end (cell 0) and receive side shifting unit cell circuitry on a terminating end (cell 5). A second shift register may be described as, e.g., as the aforementioned lower portion of the shift register of FIGS. 5a through 5c. By breaking the shift register into two separate shift register descriptions, any problems that a synthesis tool may have with the logical "loop" like design of the shift register can be avoided.

Figure 13:
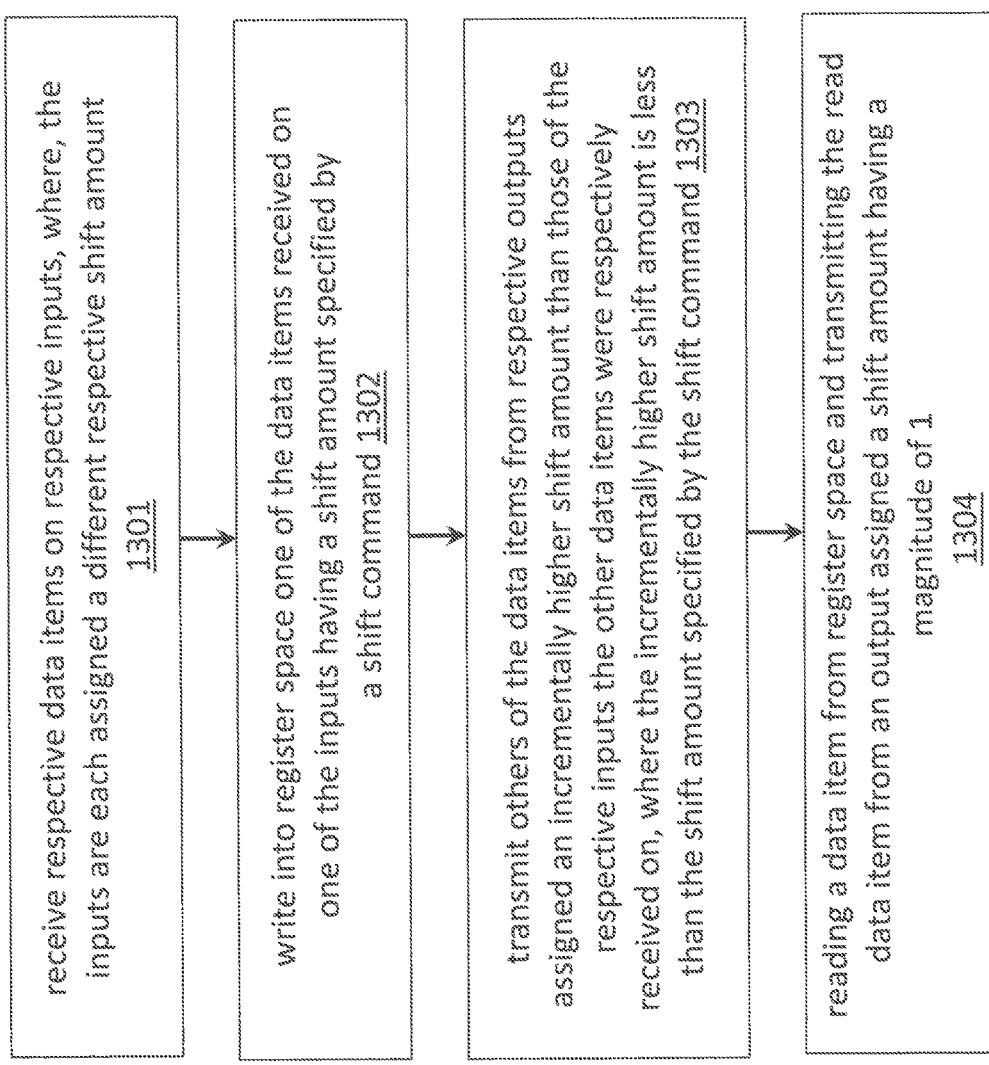
FIG. 13 shows a methodology performed by a shift register as described herein.

FIG. 13 shows a methodology performed by a cell of a shift register as described above. The method includes receiving respective data items on respective inputs, where the inputs are each assigned a different respective shift amount 1301. The method includes writing into register space one of the data items received on one of the inputs having a shift amount specified by a shift command 1302. The method includes transmitting others of the data items from respective outputs assigned an incrementally higher shift amount than those of the respective inputs the other data items were respectively received on, where the incrementally higher shift amount is less than the shift amount specified by the shift command 1303. The method includes reading a data item from register space and transmitting the read data item from an output assigned a shift amount having a magnitude of 1 1304.

Embodiments of the two dimensional shift register array described above may be implemented within an image processor having one or more integrated stencil processors. A stencil processor, as will be made more clear from the following discussion, is a processor that is optimized or otherwise designed to process stencils of image data.

Figure 14:
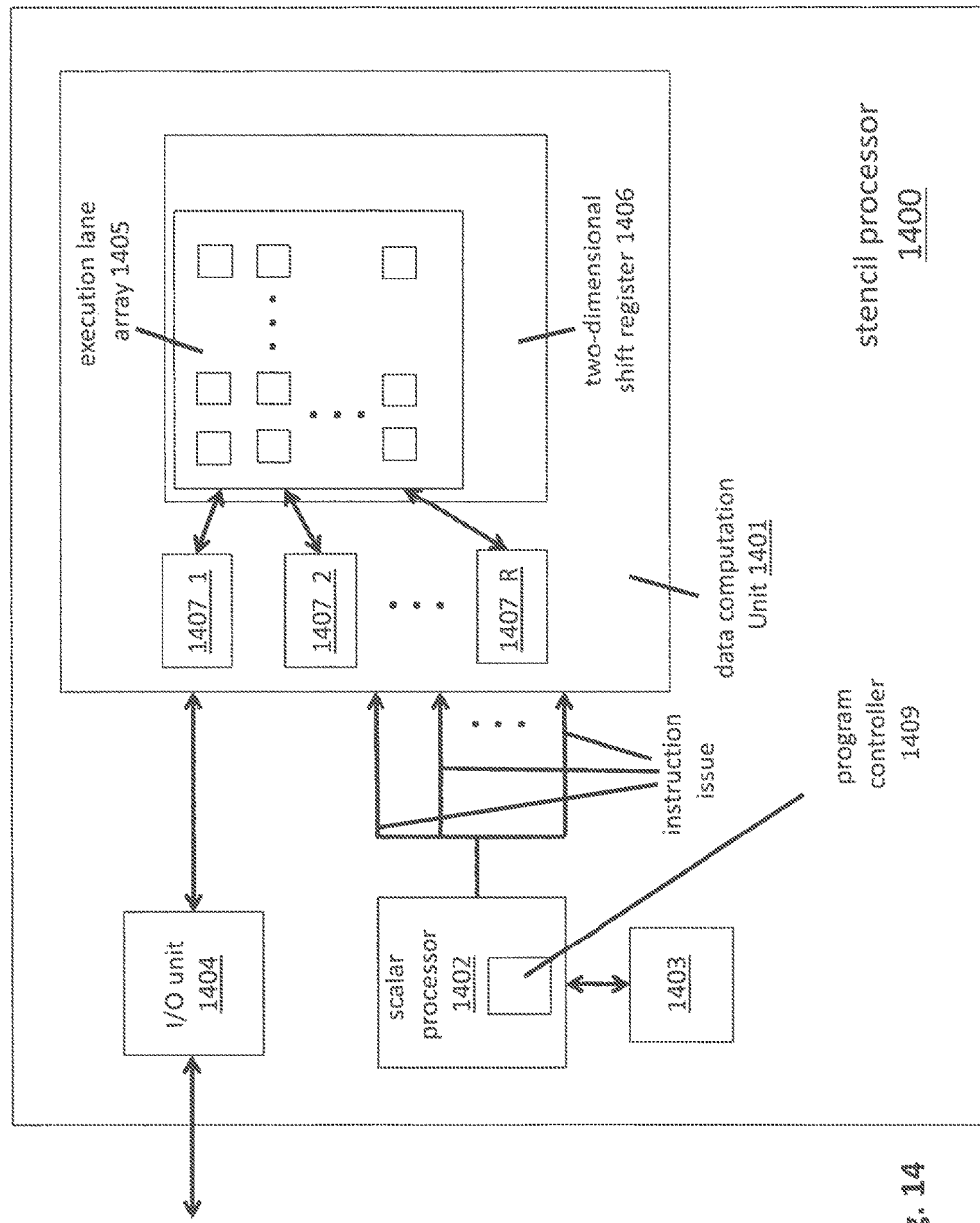
FIG. 14 shows a stencil processor component of an image processor.

FIG. 14 shows an embodiment of a stencil processor architecture 1400. As observed in FIG. 14, the stencil processor includes a data computation unit 1401, a scalar processor 1402 and associated memory 1403 and an I/O unit 1404. The data computation unit 1401 includes an array of execution lanes 1405, a two-dimensional shift array structure 1406 and separate random access memories 1407 associated with specific rows or columns of the array.

The I/O unit 1404 is responsible for loading input "sheets" of image data received into the data computation unit 1401 and storing output sheets of data from the stencil processor externally from the data computation unit. In an embodiment the loading of sheet data into the data computation unit 1401 entails parsing a received sheet into rows/columns of image data and loading the rows/columns of image data into the two dimensional shift register structure 1406 or respective random access memories 1407 of the rows/columns of the execution lane array (described in more detail below). If the sheet is initially loaded into memories 1407, the individual execution lanes within the execution lane array 1405 may then load sheet data into the two-dimensional shift register structure 1406 from the random access memories 1407 when appropriate (e.g., as a load instruction just prior to operation on the sheet's data). Upon completion of the loading of a sheet of data into the register structure 1406 (whether directly from a sheet generator or from memories 1407), the execution lanes of the execution lane array 1405 operate on the data and eventually "write back" finished data externally from the stencil processor, or, into the random access memories 1407. If the later the I/O unit 1404 fetches the data from the random access memories 1407 to form an output sheet which is then written externally from the sheet generator.

The scalar processor 1402 includes a program controller 1409 that reads the instructions of the stencil processor's program code from instruction memory 1403 and issues the instructions to the execution lanes in the execution lane array 1405. In an embodiment, a single same instruction is broadcast to all execution lanes within the array 1405 to effect a SIMD-like behavior from the data computation unit 1401. In an embodiment, the instruction format of the instructions read from scalar memory 1403 and issued to the execution lanes of the execution lane array 1405 includes a very-long-instruction-word (VLIW) type format that includes more than one opcode per instruction. In a further embodiment, the VLIW format includes both an ALU opcode that directs a mathematical function performed by each execution lane's ALU and a memory opcode (that directs a memory operation for a specific execution lane or set of execution lanes). In various embodiments, the execution lanes themselves execute their own respective shift instruction to effect a large scale SIMD two-dimensional shift of the shift register's contents.

The term "execution lane" refers to a set of one or more execution units capable of executing an instruction (e.g., logic circuitry that can execute an instruction). An execution lane can, in various embodiments, include more processor-like functionality beyond just execution units, however. For example, besides one or more execution units, an execution lane may also include logic circuitry that decodes a received instruction, or, in the case of more MIMD-like designs, logic circuitry that fetches and decodes an instruction. With respect to MIMD-like approaches, although a centralized program control approach has largely been described herein, a more distributed approach may be implemented in various alternative embodiments (e.g., including program code and a program controller within each execution lane of the array 1405).

The combination of an execution lane array 1405, program controller 1409 and two dimensional shift register structure 1406 provides a widely adaptable/configurable hardware platform for a broad range of programmable functions. For example, application software developers are able to program kernels having a wide range of different functional capability as well as dimension (e.g., stencil size) given that the individual execution lanes are able to perform a wide variety of functions and are able to readily access input image data proximate to any output array location.

During operation, because of the execution lane array 1405 and two-dimensional shift register 1406, multiple stencils of an image can be operated on in parallel (as is understood in the art, a stencil is typically implemented as a contiguous N×M or N×M×C group of pixels within an image (where N can equal M)). Here, e.g., each execution lane executes operations to perform the processing for a particular stencil worth of data within the image data, while, the two dimensional shift array shifts its data to sequentially pass the data of each stencil to register space coupled to the execution lane that is executing the tasks for the stencil. Note that the two-dimensional shift register 106 may also be of larger dimension than the execution lane array 105 (e.g., if the execution lane array is of dimension X×X, the two dimensional shift register 106 may be of dimension Y×Y where Y>X). Here, in order to fully process stencils, when the left edge of the stencils are being processed by the execution lanes, the data in the shift register 106 will "push out" off the right edge of the execution lane array 105. The extra dimension of the shift register 106 is able to absorb the data that is pushed off the edge of the execution lane array.

Apart from acting as a data store for image data being operated on by the execution lane array 1405, the random access memories 1407 may also keep one or more look-up tables. In various embodiments one or more scalar look-up tables may also be instantiated within the scalar memory 1403.

A scalar look-up involves passing the same data value from the same look-up table from the same index to each of the execution lanes within the execution lane array 1405. In various embodiments, the VLIW instruction format described above is expanded to also include a scalar opcode that directs a look-up operation performed by the scalar processor into a scalar look-up table. The index that is specified for use with the opcode may be an immediate operand or fetched from some other data storage location. Regardless, in an embodiment, a look-up from a scalar look-up table within scalar memory essentially involves broadcasting the same data value to all execution lanes within the execution lane array 1405 during the same clock cycle.

It is pertinent to point out that the various image processor architecture features described above are not necessarily limited to image processing in the traditional sense and therefore may be applied to other applications that may (or may not) cause the image processor to be re-characterized. For example, if any of the various image processor architecture features described above were to be used in the creation and/or generation and/or rendering of animation as opposed to the processing of actual camera images, the image processor may be characterized as a graphics processing unit. Additionally, the image processor architectural features described above may be applied to other technical applications such as video processing, vision processing, image recognition and/or machine learning. Applied in this manner, the image processor may be integrated with (e.g., as a co-processor to) a more general purpose processor (e.g., that is or is part of a CPU of computing system), or, may be a stand alone processor within a computing system.

The hardware design embodiments discussed above may be embodied within a semiconductor chip and/or as a description of a circuit design for eventual targeting toward a semiconductor manufacturing process. In the case of the later, such circuit descriptions may take of the form of a (e.g., VHDL or Verilog) register transfer level (RTL) circuit description, a gate level circuit description, a transistor level circuit description or mask description or various combinations thereof. Circuit descriptions are typically embodied on a computer readable storage medium (such as a CD-ROM or other type of storage technology). Circuit descriptions are typically embodied on a computer readable storage medium (such as a CD-ROM or other type of storage technology).

From the preceding sections it is pertinent to recognize that an image processor as described above may be embodied in hardware on a computer system (e.g., as part of a handheld device's System on Chip (SOC) that processes data from the handheld device's camera). In cases where the image processor is embodied as a hardware circuit, note that the image data that is processed by the image processor may be received directly from a camera. Here, the image processor may be part of a discrete camera, or, part of a computing system having an integrated camera. In the case of the later the image data may be received directly from the camera or from the computing system's system memory (e.g., the camera sends its image data to system memory rather than the image processor). Note also that many of the features described in the preceding sections may be applicable to a graphics processor unit (which renders animation).

Figure 15:
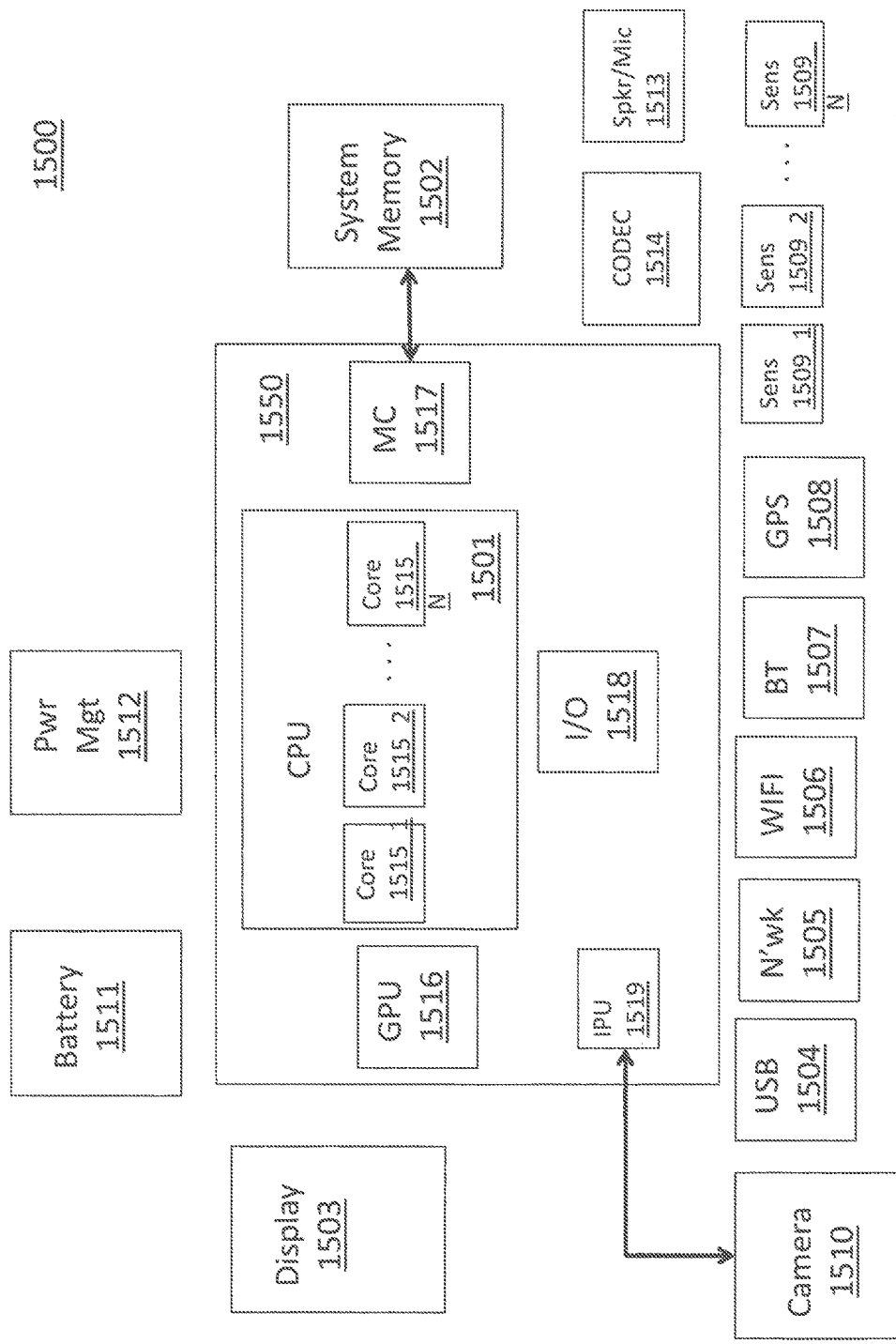
FIG. 15 shows a computing system.

FIG. 15 provides an exemplary depiction of a computing system. Many of the components of the computing system described below are applicable to a computing system having an integrated camera and associated image processor (e.g., a handheld device such as a smartphone or tablet computer). Those of ordinary skill will be able to easily delineate between the two.

As observed in FIG. 15, the basic computing system may include a central processing unit 1501 (which may include, e.g., a plurality of general purpose processing cores 1515_1 through 1515_N and a main memory controller 1517 disposed on a multi-core processor or applications processor), system memory 1502, a display 1503 (e.g., touchscreen, flat-panel), a local wired point-to-point link (e.g., USB) interface 1504, various network I/O functions 1505 (such as an Ethernet interface and/or cellular modem subsystem), a wireless local area network (e.g., WiFi) interface 1506, a wireless point-to-point link (e.g., Bluetooth) interface 1507 and a Global Positioning System interface 1508, various sensors 1509_1 through 1509_N, one or more cameras 1510, a battery 1511, a power management control unit 1512, a speaker and microphone 1513 and an audio coder/decoder 1514.

An applications processor or multi-core processor 1550 may include one or more general purpose processing cores 1515 within its CPU 1501, one or more graphical processing units 1516, a memory management function 1517 (e.g., a memory controller), an I/O control function 1518 and an image processing unit 1519. The general purpose processing cores 1515 typically execute the operating system and application software of the computing system. The graphics processing units 1516 typically execute graphics intensive functions to, e.g., generate graphics information that is presented on the display 1503. The memory control function 1517 interfaces with the system memory 1502 to write/read data to/from system memory 1502. The power management control unit 1512 generally controls the power consumption of the system 1500.

The image processing unit 1519 may be implemented according to any of the image processing unit embodiments described at length above in the preceding sections. Alternatively or in combination, the IPU 1519 may be coupled to either or both of the GPU 1516 and CPU 1501 as a co-processor thereof. Additionally, in various embodiments, the GPU 1516 may be implemented with any of the image processor features described at length above.

Each of the touchscreen display 1503, the communication interfaces 1504-1507, the GPS interface 1508, the sensors 1509, the camera 1510, and the speaker/microphone codec 1513, 1514 all can be viewed as various forms of I/O (input and/or output) relative to the overall computing system including, where appropriate, an integrated peripheral device as well (e.g., the one or more cameras 1510). Depending on implementation, various ones of these I/O components may be integrated on the applications processor/multi-core processor 1550 or may be located off the die or outside the package of the applications processor/multi-core processor 1550.

In an embodiment one or more cameras 1510 includes a depth camera capable of measuring depth between the camera and an object in its field of view. Application software, operating system software, device driver software and/or firmware executing on a general purpose CPU core (or other functional block having an instruction execution pipeline to execute program code) of an applications processor or other processor may perform any of the functions described above.

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. A device comprising a plurality of shifting unit cells that are physically arranged out of logical order, each shifting unit cell comprising local register space and circuitry having inputs configured to receive shifted data and outputs configured to transmit shifted data, wherein each of the inputs is assigned a different respective shift amount and each of the outputs is assigned a different respective shift amount, wherein the circuitry of each shifting unit cell comprises:
   (i) first circuitry configured to receive data from a preceding logically ordered shifting unit cell at a respective input assigned to a respective shift amount specified in a shift command and to write the received data into the local register space of the shifting unit cell, and
   (ii) second circuitry configured to transmit data to a following logically ordered cell from a respective output assigned to an incremented shift amount from a shift amount of an input at which the data was received.

2. The device of claim 1, wherein the second circuitry further comprises circuitry configured to read data from the local register space of the shifting unit cell and to transmit the data from an output assigned to a shift amount of 1.

3. The device of claim 1, wherein the shifting unit cells are configured to propagate data in a closed loop.

4. The device of claim 3, wherein the shifting unit cells are physically arranged such that shifts occur either in a first direction or in a second direction along the closed loop.

5. The device of claim 1, wherein each shifting unit cell is part of a bi-directional shift register.

6. The device of claim 1, wherein the plurality of shifting unit cells form a two-dimensional shift register array.

7. The device of claim 1, further comprising:
for each shifting unit cell, a non-shifting unit cell, each non-shifting unit cell having inputs to receive shifted data and corresponding outputs that transmit the received shifted data without shifting it further, wherein each of the inputs is assigned a different respective shift amount.

8. A two-dimensional shift register array comprising a plurality of rows and columns of shifting unit cells, wherein the shifting unit cells in a particular row or column are physically arranged out of logical order, each shifting unit cell comprising local register space and circuitry having inputs configured to receive shifted data and outputs configured to transmit shifted data, wherein each of the inputs is assigned a different respective shift amount and each of the outputs is assigned a different respective shift amount, wherein the circuitry of each shifting unit cell comprises:
(i) first circuitry configured to receive data from a preceding logically ordered shifting unit cell at a respective input assigned to a respective shift amount specified in a shift command and to write the received data into the local register space of the shifting unit cell, and
(ii) second circuitry configured to transmit data to a following logically ordered cell from a respective output assigned to an incremented shift amount from a shift amount of an input at which the data was received.

9. The two-dimensional shift-register array of claim 8, wherein the second circuitry further comprises circuitry configured to read data from the local register space of the shifting unit cell and to transmit the data from an output assigned to a shift amount of 1.

10. The two-dimensional shift-register array of claim 8, wherein the shifting unit cells are configured to propagate data in a closed loop.

11. The two-dimensional shift-register array of claim 10, wherein the shifting unit cells are physically arranged such that shifts occur either in a first direction or in a second direction along the closed loop.

12. The two-dimensional shift-register array of claim 8, wherein each shifting unit cell is part of a bi-directional shift register.

13. The two-dimensional shift-register array of claim 8, wherein the two-dimensional shift-register array is within a computing system having one or more processing cores coupled to a system memory.

14. The two-dimensional shift-register array of claim 8, further comprising:
for each shifting unit cell, a non-shifting unit cell, each non-shifting unit cell having inputs to receive shifted data and corresponding outputs that transmit the received shifted data without shifting it further, wherein each of the inputs is assigned a different respective shift amount.

15. An image processor comprising:
a two-dimensional execution lane array; and
a two-dimensional shift-register array comprising a plurality of rows and columns of shifting unit cells, wherein the shifting unit cells in a particular row or column are physically arranged out of logical order, each shifting unit cell comprising local register space and circuitry having inputs configured to receive shifted data and outputs configured to transmit shifted data, wherein each of the inputs is assigned a different respective shift amount and each of the outputs is assigned a different respective shift amount, wherein the circuitry of each shifting unit cell comprises:
(i) first circuitry configured to receive data from a preceding logically ordered shifting unit cell at a respective input assigned to a respective shift amount specified in a shift command and to write the received data into the local register space of the shifting unit cell, and
(ii) second circuitry configured to transmit data to a following logically ordered cell from a respective output assigned to an incremented shift amount from a shift amount of an input at which the data was received.

16. The image processor of claim 15, wherein the second circuitry further comprises circuitry configured to read data from the local register space of the shifting unit cell and to transmit the data from an output assigned to a shift amount of 1.

17. The image processor of claim 15, wherein the shifting unit cells are configured to propagate data in a closed loop.

18. The image processor of claim 17, wherein the shifting unit cells are physically arranged such that shifts occur either in a first direction or in a second direction along the closed loop.

19. The image processor of claim 15, further comprising:
for each shifting unit cell, a non-shifting unit cell, each non-shifting unit cell having inputs to receive shifted data and corresponding outputs that transmit the received shifted data without shifting it further, wherein each of the inputs is assigned a different respective shift amount.

* * * * *

UNITED STATES PATENT AND TRADEMARK OFFICE
CERTIFICATE OF CORRECTION

PATENT NO. : 10,313,641 B2  
APPLICATION NO. : 15/352260  
DATED : June 4, 2019  
INVENTOR(S) : Redgrave Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 130 days.

Signed and Sealed this  
Seventh Day of September, 2021

Drew Hirshfeld  
*Performing the Functions and Duties of the*  
*Under Secretary of Commerce for Intellectual Property and*  
*Director of the United States Patent and Trademark Office*